(12) United States Patent
Shinjo

(10) Patent No.: US 7,049,642 B2
(45) Date of Patent: May 23, 2006

(54) SEMICONDUCTOR DEVICE, AND WIRING-LAYOUT DESIGN SYSTEM FOR AUTOMATICALLY DESIGNING WIRING-LAYOUT IN SUCH SEMICONDUCTOR DEVICE

(75) Inventor: Keisuke Shinjo, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/940,645

(22) Filed: Sep. 15, 2004

(65) Prior Publication Data

US 2005/0056932 A1    Mar. 17, 2005

(30) Foreign Application Priority Data

Sep. 16, 2003    (JP) .............................. 2003-322488

(51) Int. Cl.
| | |
|---|---|
| H01L 27/10 | (2006.01) |
| H01L 23/48 | (2006.01) |
| H01L 23/52 | (2006.01) |
| H01L 29/40 | (2006.01) |

(52) U.S. Cl. ...................... 257/207; 257/203; 257/737; 257/758

(58) Field of Classification Search ........ 257/203–207, 257/737–758

See application file for complete search history.

(56) References Cited

FOREIGN PATENT DOCUMENTS

| JP | 6-061428 | 3/1994 |
|---|---|---|
| JP | 2001-060625 A | 3/2001 |

*Primary Examiner*—Cuong Nguyen
(74) *Attorney, Agent, or Firm*—Foley & Lardner LLP

(57) ABSTRACT

In a semiconductor device having a plurality of area sections defined therein, a basic multi-layered wiring arrangement is provided on a semiconductor substrate, and both the substrate and the basic multi-layered wiring arrangement have an internal electronic circuit area section and an I/O area section defined in each of the area sections. A plurality of electronic circuits are produced in the circuit area section, and an I/O buffer is produced in the I/O area section. The I/O buffer is suitably and electrically connected to the internal electronic circuits in the basic arrangement. An external multi-layered wiring arrangement is provided on the basic arrangement, and has a power supply electrode pad, a ground electrode pad, at least one signal electrode pad formed and arranged on a top surface thereof, and a wiring-layout produced therein to establish electrical connections between the I/O buffer and the electrode pads. The wiring-layout includes a plurality of conductive paths for establishing the electrical connection between the I/O buffer and the power supply electrode pad, a plurality of conductive paths for establishing the electrical connection between the I/O buffer and the ground electrode pad, and a conductive path for establishing the electrical connection between the I/O buffer and the signal electrode pad, and all the conductive paths feature the same width as each other.

13 Claims, 14 Drawing Sheets

Fig. 9
OPTION I 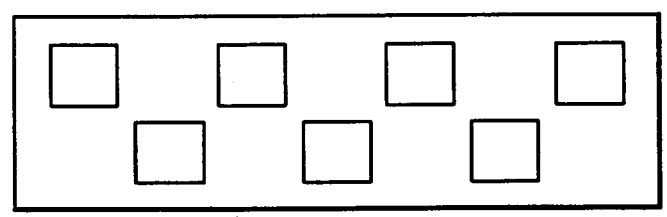
OPTION II 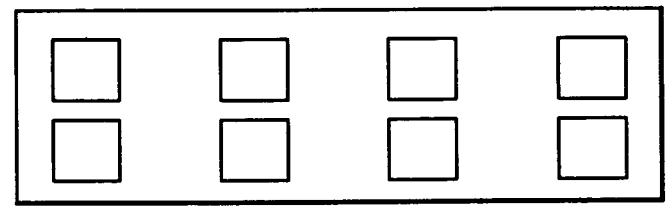
OPTION III 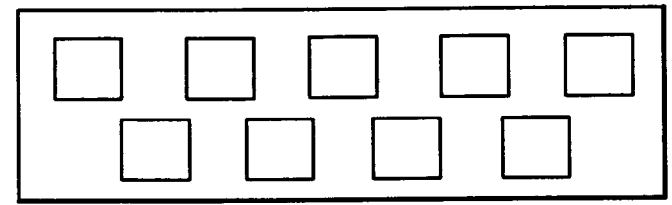
OPTION IV 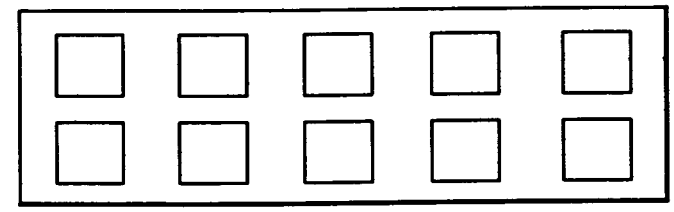

Fig. 10
OPTION I 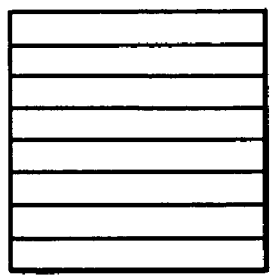
OPTION II 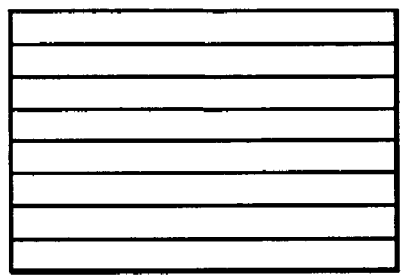
OPTION III 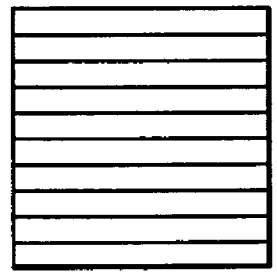
OPTION IV 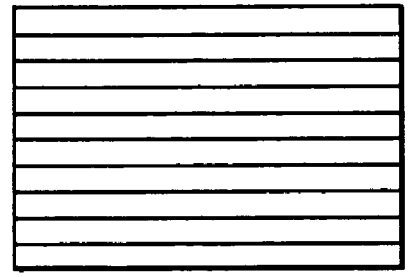

SEMICONDUCTOR DEVICE, AND WIRING-LAYOUT DESIGN SYSTEM FOR AUTOMATICALLY DESIGNING WIRING-LAYOUT IN SUCH SEMICONDUCTOR DEVICE

BACKGROUND OF THE INVENTION

1. Field of the Invention

The present invention relates to a semiconductor device, and a wiring-layout design system for automatically designing a wiring-layout for electrode pads provided on a semiconductor device.

2. Description of the Related Art

A representative semiconductor device, which is frequently called an IC (integrated circuit) chip, comprises a semiconductor substrate having a basic multi-layered wiring arrangement provided thereon, and the basic multi-layered wiring arrangement is sectioned into a central internal electronic circuit area section, and a peripheral input/output (I/O) area section surrounding the central internal electronic circuit area section.

In the central internal electronic circuit area section, various active regions are defined in the semiconductor substrate, and patterned wiring layers are formed in the basic multi-layered wiring arrangement, whereby a plurality of internal electronic circuits are produced in the central internal electronic circuit area section.

Also, input/output (I/O) buffers and power supply voltage buffers are produced and arranged in the peripheral I/O area section. The I/O buffers have a smaller size than that of the power supply voltage buffers. The power supply voltage buffers are discretely arranged in the peripheral I/O area section, and the I/O buffers are arrayed between two adjacent power supply voltage buffers, as disclosed in, for example, JP-A-2001-060625.

The internal electronic circuits are suitably and electrically connected to the I/O buffers through the intermediary of conductive paths included in the patterned wiring layers formed in the basic multi-layered wiring arrangement, and each of the power supply voltage buffers is electrically connected to some of the I/O buffers, provided on both sides thereof, through the intermediary of a wiring pattern formed in the basic multi-layered wiring arrangement, to thereby supply the I/O buffers with electrical power.

The semiconductor device further comprises an external multi-layered wiring arrangement provided on the basic multi-layered wiring arrangement, and the external multi-layered wiring arrangement has a plurality of signal electrode pads and a plurality of power supply electrode pads, which are formed on a top surface thereof. Each of the signal electrode pads is electrically connected to a corresponding I/O buffer through the intermediary of a conductive signal path formed in the external multi-layered wiring arrangement, and each of the power supply electrode pads is electrically connected to a corresponding power supply buffer through the intermediary of a conductive power supply path formed in the external multi-layered wiring arrangement.

Each of the conductive power supply paths for establishing the electrical connections between the power supply electrode pads and the power supply voltage buffers has a relatively large width in that a large amount of electric current flows through the conductive power supply path, because all the I/O buffers connected to each of the power supply voltage buffers are supplied with the electric power by the conductive power supply path concerned. On the contrary, each of the conductive signal paths for establishing the electrical connections between the signal electrode pads and the I/O buffers is narrower in comparison with the conductive power supply paths.

In this conventional semiconductor device, the arrangement of the I/O buffers is restricted in that the I/O buffers must be arrayed between the two adjacent power supply voltage buffers. In other words, it is impossible to produce the I/O buffers at a high density in the peripheral I/O area section, and this is disadvantageous in miniaturizing the semiconductor device.

Further, it is troublesome and difficult to automatically design a wiring-layout of the conductive power supply and signal paths in the external multi-layered wiring arrangement, because the wiring-layout must be formed by the wider conductive power supply paths and the narrower conductive signal paths. As a result, a freedom of design of the wiring-layout in the external multi-layered wiring arrangement is considerably restricted.

JP-A-HEI06-061428 discloses a flip-chip type semiconductor device comprising a semiconductor substrate having a basic multi-layered wiring arrangement provided thereon, and the basic multi-layered wiring arrangement is sectioned into a plurality of area sections. In each of the area sections, various active regions are defined in the semiconductor substrate, and patterned wiring layers are formed in the basic multi-layered wiring arrangement, whereby a plurality of internal electronic circuits are produced in the area section concerned. Also, input/output (I/O) buffers are produced in each of the area sections, the internal electronic circuits are suitably and electrically connected to the I/O buffers through the intermediary of conductive paths included in the patterned wiring layers.

The flip-chip type semiconductor device further comprises an external multi-layered wiring arrangement provided on the basic multi-layered wiring arrangement, and the external multi-layered wiring arrangement is sectioned into a plurality of area sections in substantially the same manner as the basic multi-layered wiring arrangement. Each of the area sections has a plurality of signal electrode pads and a pair of power supply electrode pads, which is formed on a top surface of the area section concerned.

Each of the signal electrode pads is electrically connected to a corresponding I/O buffer through the intermediary of a conductive signal path formed in the external multi-layered wiring arrangement. On the other hand, each of the power supply electrode pads is electrically connected to the I/O buffers through the intermediary of a power supply bus formed in the external multi-layered arrangement. In particular, the power supply bus includes a main bus portion connected to the power supply pad concerned, an auxiliary bus portion extending from the main bus portion, and branch portions extending from the auxiliary bus portion and connected to the respective I/O buffers, to thereby supply the I/O buffers with electrical power.

In this conventional flip-chip type semiconductor device, since the I/O buffers are supplied with the electric power through the power supply buses, no power supply voltage buffers are produced in the basic multi-layered wiring arrangement. This is advantageous in miniaturizing the flip-chip type semiconductor device, because the internal electronic circuits and the I/O buffers can be produced at a high density in the basic multi-layered wiring arrangement. Nevertheless, in reality, the miniaturization of the flip-chip type semiconductor device is not hopeful in that the power supply buses occupy a relatively large area in the external multi-layered wiring arrangement. Also, it is troublesome and difficult to automatically design a wiring-layout of the power supply buses in the external multi-layered wiring arrangement, because each of the power supply buses must be formed by relatively complex and widened conductive paths, resulting in restriction of freedom of design of the wiring-layout in the external multi-layered wiring arrangement.

SUMMARY OF THE INVENTION

Therefore, an object of the present invention is to provide a semiconductor device including a wiring-layout of conductive paths for establishing electrical connections between input/output buffers and various electrode pads, wherein the conductive paths have substantially the same width as each other so that an automatic design of the wiring-layout of conductive paths can be facilitated.

Another object of the present invention is to provide a design system for automatically designing such a wiring-layout of conductive paths.

In accordance with an aspect of the present invention, there is provided a semiconductor device having a plurality of area sections defined therein. The semiconductor device comprises a semiconductor substrate, and a basic multi-layered wiring arrangement provided on the semiconductor substrate, and both the semiconductor substrate and the basic multi-layered wiring arrangement have an internal electronic circuit area section and an input/output (I/O) area section defined in each of the area sections. A plurality of internal electronic circuits are produced in the internal electronic circuit area section, and an input/output (I/O) buffer is produced in the I/O area section. The I/O buffer is suitably and electrically connected to the internal electronic circuits in the basic multi-layered wiring arrangement. The semiconductor device also comprises an external multi-layered wiring arrangement provided on the basic multi-layered wiring arrangement and having a power supply electrode pad, a ground electrode pad, at least one signal electrode pad formed and arranged on a top surface thereof, and a wiring-layout produced therein to establish electrical connections between the I/O buffer and the electrode pads. The wiring-layout includes a plurality of power supply conductive paths for establishing the electrical connection between the I/O buffer and the power supply electrode pad, a plurality of ground conductive paths for establishing the electrical connection between the I/O buffer and the ground electrode pad, and a signal conductive path for establishing the electrical connection between the I/O buffer and the signal electrode pad, and all the conductive paths feature the same width as each other.

In this semiconductor device, a number of the power supply conductive paths is determined in accordance with a predetermined amount of electric current flowing between the I/O buffer and the power supply electrode pad. In this case, a number of the ground conductive paths is equal to the number of the power supply conductive paths.

Preferably, the I/O buffer has a plurality of input/output (I/O) cells, and each of the I/O cells has a power supply port, a ground port, and a signal port defined thereon. In this case, each of the power supply conductive paths is electrically connected to one of the power supply ports, each of the ground conductive paths is electrically connected to one of the ground ports, and each of the signal conductive paths is electrically connected to one of the signal ports.

The external multi-layered wiring arrangement may include a lowermost insulating layer formed on the basic multi-layered wiring arrangement, at least one intermediate insulating layer formed on the lowermost insulating layer, and an uppermost insulating layer formed on the intermediate insulating layer. Each of the power supply and ground conductive paths includes a lower conductive path segment formed on the lowermost insulating layer, and an upper conductive path segment formed on the intermediate insulating layer. One end of the lower conductive path segment is electrically connected to a corresponding port of an I/O cell of the I/O buffer through a via structure formed in the basic multi-layered wiring arrangement and the lowermost insulating layer of the external multi-layered wiring arrangement, the end of the lower conductive path segment is electrically connected to one end of the upper conductive path segment through a via structure formed in the intermediate insulating layer, and the other end of the upper conductive path segment being electrically connected to a corresponding electrode pad through a via structure formed in the uppermost insulting layer.

In accordance with another aspect of the present invention, there is provided a wiring-layout design system for designing a wiring-layout in an external multi-layer wiring arrangement of a semiconductor device as mentioned above. The wiring-layout design system comprises the steps of: a display unit that displays a surface of a semiconductor chip for producing the semiconductor device; an area section definition system that defines a plurality of area sections to be defined on the displayed surface of the semiconductor chip in accordance with a chip size thereof; an electrode pad array definition system that regularly defines a plurality of electrode pads on the displayed surface of the semiconductor chip such that a set of a power supply electrode pad, a ground pad, and at least one signal electrode pad is displayed on each of the area sections; an input/output (I/O) buffer definition system that defines an input/output (I/O) buffer on each of the area sections; a path-number determination system that determines a number N of conductive paths for establishing an electrical connection between the I/O buffer and each of the power supply and ground electrode pads in accordance with a predetermined amount of electric current flowing therebetween; a pad division/display system that divides each of the power supply and ground electrode pads into N pad segments on the display unit; and a wiring-layout definition system that defines a wiring-layout, to be produced in the external multi-layered wiring arrangement of the semiconductor device, on each of the area sections to establish electrical connections between the I/O buffer and the pad segments and signal pad.

In this wiring-layout design system, the wiring-layout includes a plurality of power supply conductive paths for establishing the electrical connection between the I/O buffer and the pad segments of the power supply electrode pad, a plurality of ground conductive paths for establishing the electrical connection between the I/O buffer and the pad segments of the ground electrode pad, and a signal conductive path for establishing the electrical connection between the I/O buffer and the signal electrode pad.

In the wiring-layout design system, preferably, the I/O buffer has a plurality of input/output (I/O) cells, and each of the I/O cells has a power supply port, a ground port defined thereon. Each of the power supply conductive paths is electrically connected to one of the power supply ports, each of the ground conductive paths is electrically connected to one of the ground ports, and each of the signal conductive paths is electrically connected to one of the signal ports.

Preferably, the external multi-layered wiring arrangement includes a lowermost insulating layer formed on the basic multi-layered wiring arrangement, at least one intermediate insulating layer formed on the lowermost insulating layer, and an uppermost insulating layer formed on the intermediate insulating layer. Each of the power supply and ground conductive paths includes a lower conductive path segment to be formed on the lowermost insulating layer, and an upper conductive path segment to be formed on the intermediate insulating layer. One end of the lower conductive path segment is electrically connected to a corresponding port of an I/O cell of the I/O buffer through a via structure to be formed in the basic multi-layered wiring arrangement and the lowermost insulating layer of the external multi-layered wiring arrangement, and the other end of the lower conductive path segment is electrically connected to one end of the upper conductive path segment through a via structure to be formed in the intermediate insulating layer. The other end of the upper conductive path segment is electrically connected to a corresponding electrode pad through a via structure to be formed in the uppermost insulting layer.

Preferably, the lower conductive path segments are displayed on the display unit at a width which is different from that of the upper conductive path segments, so that the lower conductive path segments and the upper conductive path segments can be easily distinguished from each other on the display unit.

BRIEF DESCRIPTION OF THE DRAWINGS

The above objects and other objects will be more clearly understood from the description set forth below, with reference to the accompanying drawings, wherein:

FIG. 9 is a conceptual view of a pad array library stored in a hard disk of the wiring-layout design system shown in FIG. 8;

FIG. 10 is a conceptual view of an input/output buffer library stored in the hard disk of the wiring-layout design system shown in FIG. 8;

DESCRIPTION OF THE PREFERRED EMBODIMENTS

Figure 1:
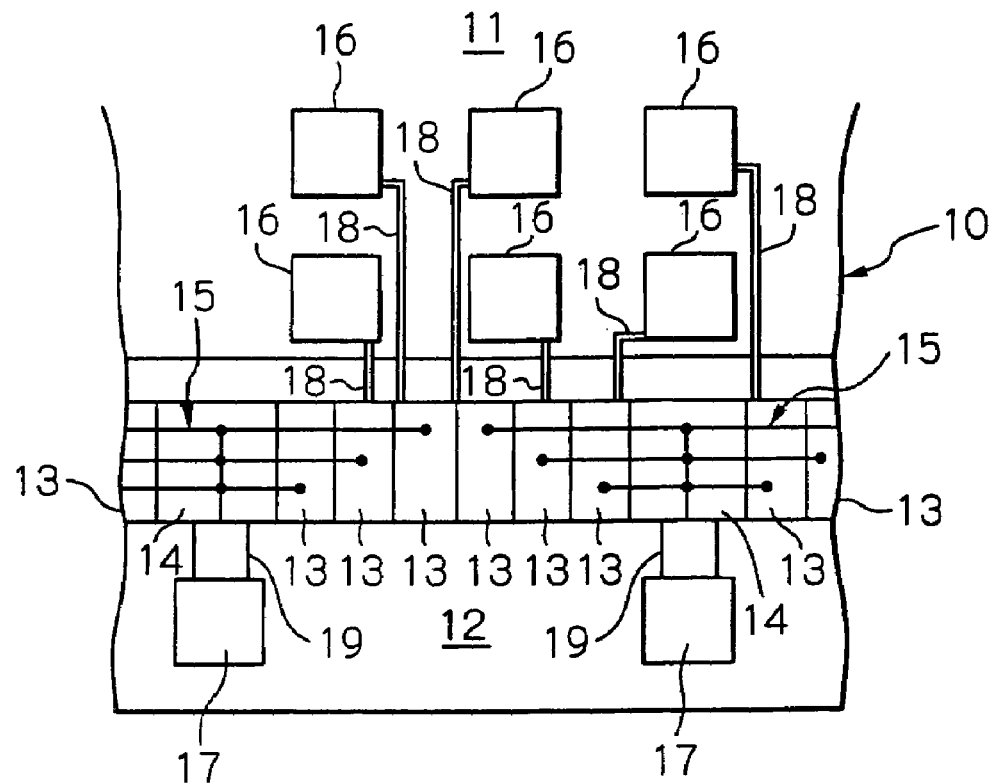
FIG. 1 is a conceptual and schematic plan view showing a part of a first conventional semiconductor device.

Before descriptions of an embodiment of the present invention, for better understanding of the present invention, a first conventional semiconductor device will be explained with reference to FIG. 1. Note, in FIG. 1, a part of the first conventional semiconductor device is conceptually and schematically illustrated.

This conventional semiconductor device comprises a semiconductor substrate having a basic multi-layered wiring arrangement 10 provided thereon, and the basic multi-layered wiring arrangement 10 is sectioned into a central internal circuit area section 11, and a peripheral input/output (I/O) area section 12 surrounding the central internal circuit area section 11. Although not visible in FIG. 1, various internal electronic circuits are produced in an interior of the central internal circuit area section 11. Also, input/output (I/O) buffers 13 and power supply voltage buffers 14 are produced and arranged in an interior of the peripheral I/O area section 12. Note, in FIG. 1, although the I/O buffers 13 and the power supply voltage buffers 14 are illustrated for the sake of convenience, in reality, these buffers 13 and 14 are not visible because they are produced in an interior of the peripheral I/O area section 12.

As is apparent from FIG. 1, the power supply voltage buffers 14 are discretely arranged in the peripheral I/O area section 12, and the I/O buffers 13 are closely arrayed between two adjacent power supply voltage buffers 14, as disclosed in, for example, JP-A-2001-060625.

The internal electronic circuits are suitably and electrically connected to the I/O buffers 13 through the intermediary of patterned wiring layers (not shown) formed in the interior of the basic multi-layered wiring arrangement 10, and each of the power supply voltage buffers 14 is electrically connected to some of the I/O buffers 13, provided on both the sides thereof, through the intermediary of a wiring pattern 15 formed in the basic multi-layered wiring arrangement 10, to thereby supply the I/O buffers 13 with electrical power.

Although not shown in FIG. 1, the semiconductor device further comprises an external multi-layered wiring arrangement formed on a top surface of the basic multi-layered wiring arrangement 10, and the basic multi-layered wiring arrangement has a plurality of signal electrode pads 16 and a plurality of power supply electrode pads 17 formed on a top surface thereof. Each of the signal electrode pads 16 is electrically connected to a corresponding I/O buffer 13 through the intermediary of a conductive signal path 18 formed in the interior of the external multi-layered wiring arrangement, and each of the power supply electrode pads 17 is electrically connected to a corresponding power supply voltage buffer 14 through the intermediary of a conductive power supply path 19 formed in the external multi-layered wiring arrangement.

As is apparent from FIG. 1, the conductive power supply paths 19 for establishing the electrical connections between the power supply voltage buffers 14 and the power supply electrode pads 17 are wider in comparison with the conductive signal paths 18 for establishing the electrical connection the I/O buffers 13 and the signal electrode pads 16, because a large amount of electric current flows through each of the conductive power supply paths 19 to thereby supply the electric power to all the I/O buffers 13, which are connected to the power supply voltage buffer 14 by each of the wiring pattern 15.

As already discussed above, in this conventional semiconductor device, the arrangement of the I/O buffers 13 is restricted in that they must be arrayed between the two adjacent power supply voltage buffers 14, resulting in the hindrance of a miniaturization of the semiconductor device. Also, it is troublesome and difficult to automatically design a wiring-layout of the conductive signal and power supply paths 18 and 19 in the external multi-layered wiring arrangement, because the wiring-layout must be formed by the narrower conductive signal paths 18 and the wider conductive power supply paths 19. Namely, a freedom of design of the wiring-layout in the external multi-layered wiring arrangement is considerably restricted.

Next, with reference to FIG. 2, a second conventional semiconductor device, which is disclosed as a flip-chip type semiconductor device in the above-mentioned JP-A-HEI06-061428, will be explained. Note, in FIG. 2, only a part of the second conventional semiconductor device is conceptually and schematically illustrated.

Figure 2:
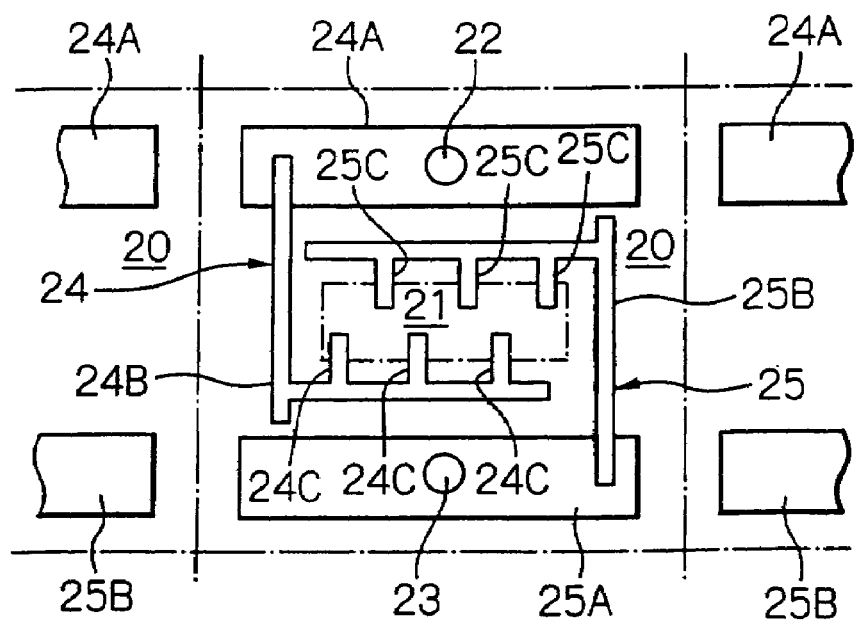
FIG. 2 is a conceptual and schematic plan view showing a part of a second conventional semiconductor device.

The second conventional semiconductor device also comprises a semiconductor substrate having a basic multi-layered wiring arrangement provided thereon, and the basic multi-layered wiring arrangement is sectioned into a plurality of area sections 20, as expediently represented by single-dot chain lines in FIG. 2. Although not visible, various internal electronic circuits are produced in each of the area sections 20.

Also, an input/output (I/O) area 21 is defined in each of the area sections 20, as expediently represented by single-dot chain lines in FIG. 2, and a plurality of input/output (I/O) buffers (not shown) are produced in the I/O area 21. The internal electronic circuits are suitably and electrically connected to the I/O buffers through the intermediary of patterned wiring layers (not shown) formed in the basic multi-layered wiring arrangement.

The flip-chip type semiconductor device further comprises an external multi-layered wiring arrangement provided on the basic multi-layered wiring arrangement, and the external multi-layered wiring arrangement is sectioned into a plurality area sections in substantially the same manner as the basic multi-layered wiring arrangement. Although not shown in FIG. 2, each of the area sections has a plurality of signal electrode pads formed on a top surface thereof, and each of the signal electrode pads is electrically connected to a corresponding I/O buffer through the intermediary of a conductive signal path formed in the external multi-layered wiring arrangement.

Also, as representatively shown in FIG. 2, a pair of power supply voltage electrode pads 22 and 23 are formed on the top surface of each of the area sections of the external multi-layered wiring arrangement, and the power supply electrode pads 22 and 23 are electrically connected to the I/O buffers through the intermediary of respective power supply buses 24 and 25 formed in the external multi-layered arrangement.

In particular, each of the power supply buses 24 and 25 includes a main bus portion (24A, 25A) connected to a corresponding power supply voltage pad (22, 23), an auxiliary bus portion (24B, 25B) extending from the main bus portion (24A, 25A), and branch portions (24C, 25C) extending from the auxiliary bus portion (24B, 25B) and connected to the respective I/O buffers, whereby the I/O buffers are supplied with electrical power.

In this second conventional semiconductor device, since the I/O buffers are supplied with the electric power through the power supply buses 24 and 25, no power supply voltage buffers are produced in the basic multi-layered wiring arrangement. Of course, this is advantageous in miniaturizing the second conventional semiconductor device, because the internal electronic circuits and the I/O buffers can be produced at a high density in the basic multi-layered wiring arrangement. Nevertheless, in reality, as already stated, the miniaturization of the second conventional semiconductor device is not hopeful in that the power supply buses 24 and 25 occupy a relatively large area in the external multi-layered wiring arrangement. Also, it is troublesome and difficult to automatically design a wiring-layout of the power supply buses 24 and 25 in the external multi-layered wiring arrangement, because each of the power supply buses 24 and 25 must be formed by relatively complex and widened conductive paths, resulting in restriction of a freedom of design of the wiring-layout in the external multi-layered wiring arrangement.

Note, in FIG. 2, although each of the auxiliary bus portions 24B and 25B are illustrated as a narrower one in comparison with a corresponding main bus portion (24A, 24A), it should have the same width as the main bus portions (24A, 24A), because the same amount of electric current must flow through the main and auxiliary bus portions (24A and 24B, 25A and 25B).

With reference to FIGS. 3 to 7, an embodiment of a semiconductor device according to the present invention will be explained below.

Figure 3:
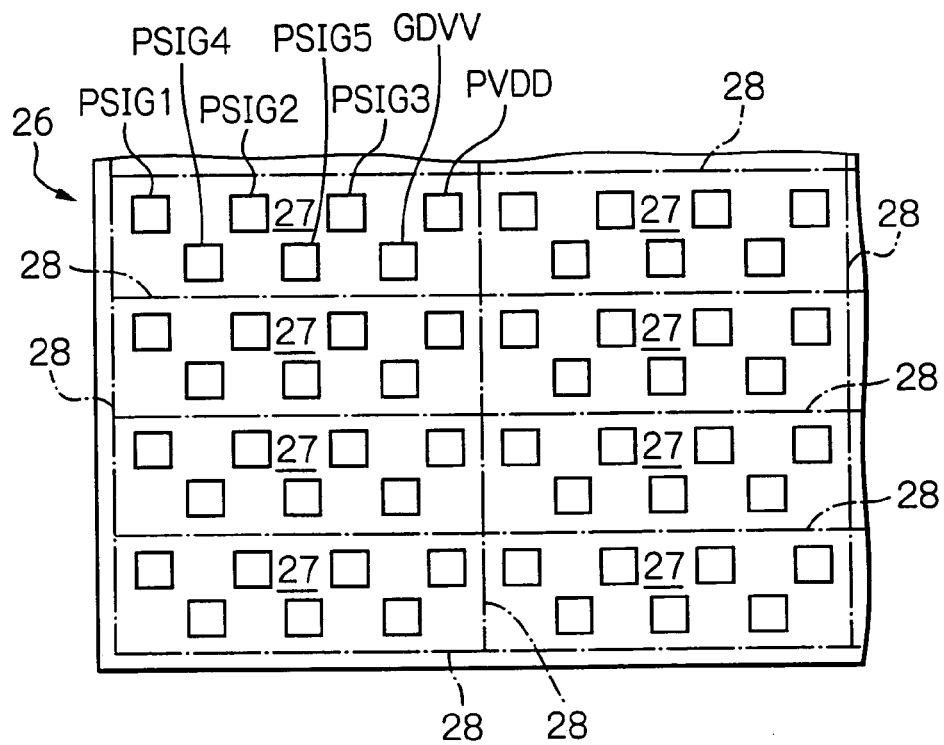
FIG. 3 is a conceptual and schematic plan view showing a part of an embodiment of a semiconductor device according to the present invention.
Figure 4:
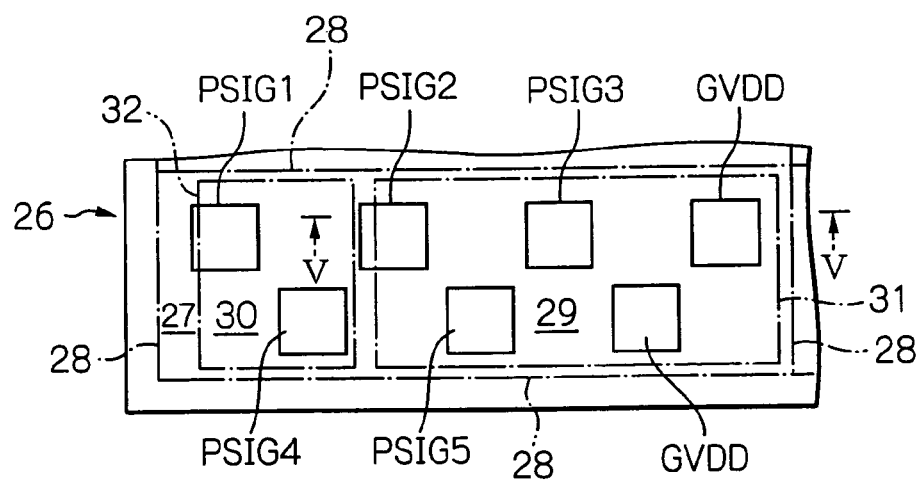
FIG. 4 is a partially-enlarged plan view of the FIG. 3.
Figure 5:
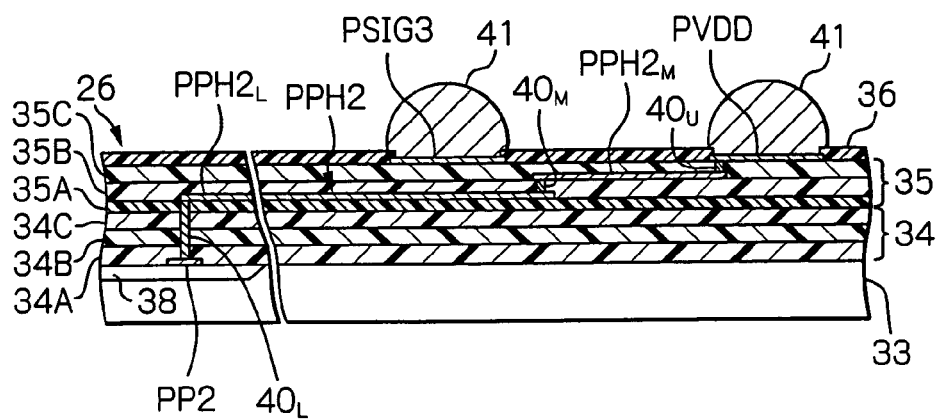
FIG. 5 is a partial cross-sectional view taken along the V—V line of FIG. 4.

In FIGS. 3 to 5, the semiconductor device is generally indicated by reference 26, and is produced as a flip-chip type BGA (ball grid array) chip. As is apparent from FIG. 3, a plurality of rectangular area sections 27 are defined in the semiconductor device 26, as expediently represented by single-dot chain lines 28. Also, as representatively shown in FIG. 4, an internal electronic circuit area section 29 and an input/output (I/O) area section 30 are defined in each of the rectangular area sections 27, as expediently represented by single-dot chain lines 31 and 32.

As shown in FIG. 5, the semiconductor device 26 comprises a semiconductor or silicon substrate 33, a basic multi-layered wiring arrangement 34 provided on the silicon substrate 33, an external multi-layered wiring arrangement 35 provided on the basic multi-layered wiring arrangement 34, and a passivation layer 36 formed as a protective layer on the external multi-layered wiring arrangement 35.

In this embodiment, the basic multi-layered wiring arrangement 34 includes three insulating layers, i.e. a lowermost insulating layer 34A, an intermediate insulating layer 34B and an uppermost insulating layer 34C which are laminated in order on the silicon substrate 33. Although not visible in FIG. 5, in each of the internal electronic circuit area sections 29, various active regions are defined in the silicon substrate 33, and each of the insulating layers 34A, 34B and 34C has a plurality of patterned wiring layers formed thereon, whereby a plurality of internal electronic circuits are produced in the internal electronic circuit area section 29.

Figure 6:
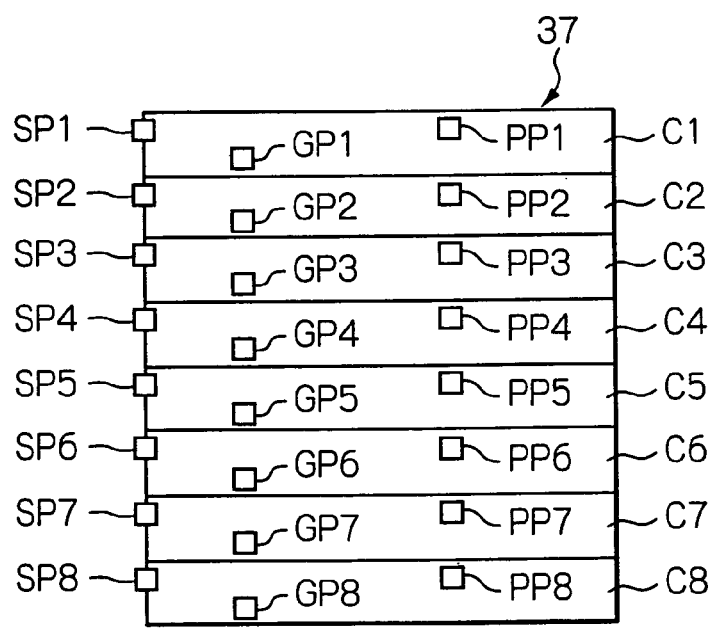
FIG. 6 is a plan view of an input/output area section produced in a basic multi-layered wiring arrangement of the semiconductor device according to the present invention.

Also, in each of the I/O area sections 30, various active regions are defined in the silicon substrate 33, and collaborate with the patterned wiring layers formed in the basic multi-layered wiring arrangement 34, such that an input/output (I/O) buffer 37, as shown in FIG. 6, is produced in the I/O area section 30. Note, in FIG. 5, only one of the active regions defined in the silicon substrate 33 and forming a part of the I/O buffer 37 is representatively indicated by reference 38. The I/O buffer 37 comprises a set of eight input/output (I/O) cells C1 to C8, and these I/O cells C1 to C8 are suitably and electrically connected to the above-mentioned internal electronic circuits through the intermediary of conductive paths (not visible) which are included in the patterned wiring layers formed in the basic multi-layered wiring arrangement 34. Further, as shown in FIG. 6, each of the I/O cells C1 to C8 has a power supply port (PP1, PP2, . . . , PP7, PP8), a ground port (GP1, GP2, . . . , GP7, GP8), and a signal port (SP1, SP2, . . . , SP7, SP8) defined thereon.

Figure 7:
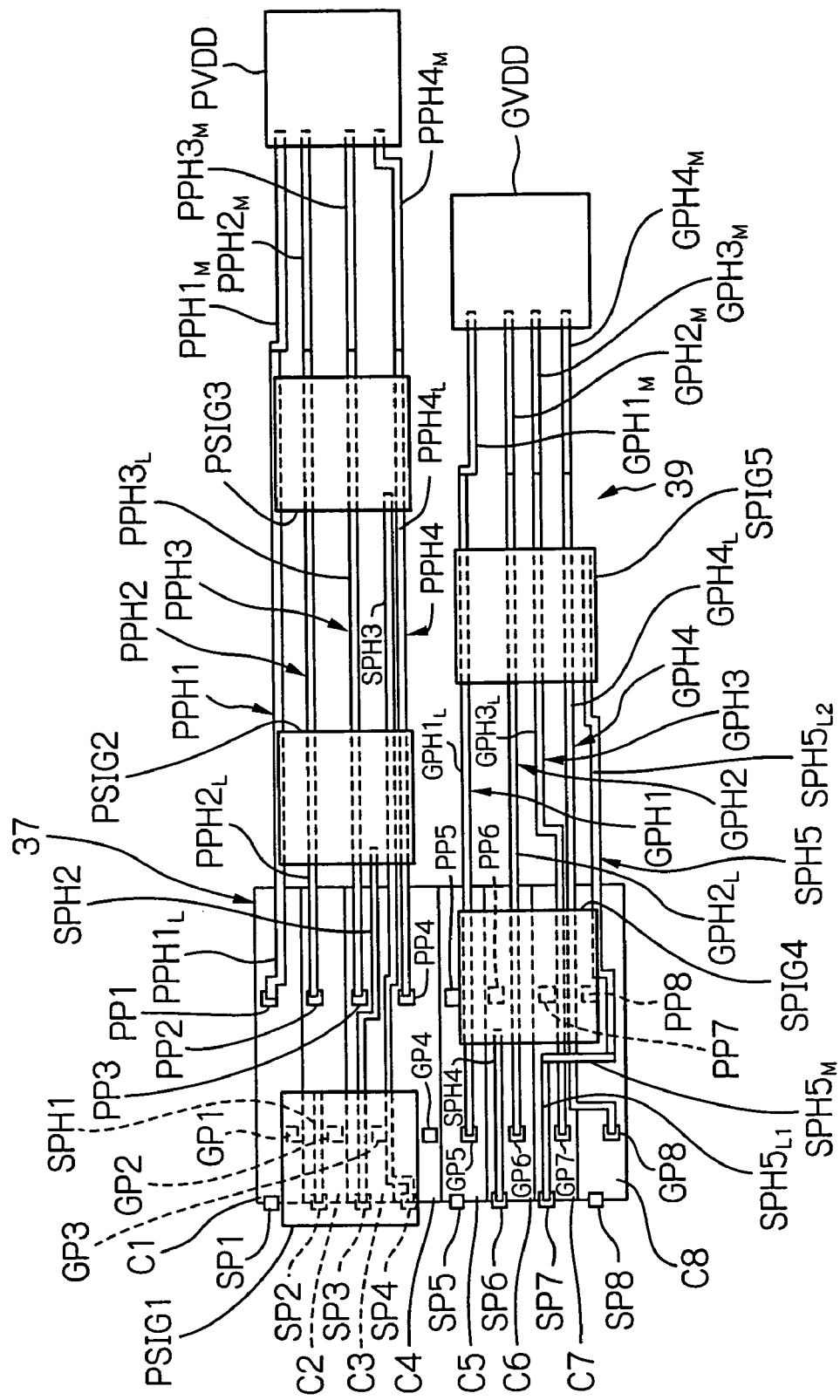
FIG. 7 is a partial plan view showing a wiring-layout of conductive paths formed in an external multi-layer wiring arrangement of the semiconductor device according to the present invention.

As shown in FIG. 5, in this embodiment, the external multi-layered wiring arrangement 35 includes at least three insulating layers: a lowermost insulating layer 35A, an intermediate insulating layer 35B, and an uppermost insulating layer 35C, which are laminated in order on the basic multi-layered wiring arrangement 34. As shown in FIG. 7 by way of example, in each of the rectangular area sections 27, a wiring-layout, generally indicated by reference 39, is produced in both the lowermost and intermediate insulating layers 35A and 35B, and seven electrode pads PVDD, GVDD, PSIG1, PSIG2, PSIG3, PSIG4 and PSIG5 are formed and arranged on a top surface of on the uppermost insulating layer 35C. The electrode pad PVDD serves as a power supply electrode pad, the electrode pad GVDD serves as a ground electrode pad, and each of the electrode pads PSIG1, PSIG2, PSIG3, PSIG4 and PSIG5 serves as a signal electrode pad. These electrode pads PVDD, GVDD, PSIG1, PSIG2, PSIG3, PSIG4 and PSIG5 are suitably and electrically connected to the I/O buffer 37 through the intermediary of the wiring-layout 39.

In particular, the wiring-layout 39 comprises four power supply conductive paths PPH1, PPH2, PPH3 and PPH4, which are used to establish the electrical connections between the power supply electrode pad PVDD and the power supply ports PP1, PP2, PP3 and PP4 of the I/O cells C1, C2, C3 and C4, as shown in FIG. 7. Each of the power supply conductive paths PPH1, PPH2, PPH3 and PPH4 includes a lower conductive path segment (PPH1$_L$, PPH2$_L$, PPH3$_L$, PPH4$_L$) formed on the lowermost insulating layer 35A, and an upper conductive path segment (PPH1$_M$, PPH2$_M$, PPH3$_M$, PPH4$_M$) formed on the intermediate insulating layer 35B.

One end of the lower conductive path segment (PPH1$_L$, PPH2$_L$, PPH3$_L$, PPH4$_L$) is electrically connected to a corresponding power supply port (PP1, PP2, PP3, PP4) through the intermediary of a via structure formed in the basic multi-layered wiring arrangement 34 and the lowermost insulating layer 35A, and the other end of the lower conductive path segment (PPH1$_L$, PPH2$_L$, PPH3$_L$, PPH4$_L$) is electrically connected to one end of a corresponding upper conductive path segment (PPH1$_M$, PPH2$_M$, PPH3$_M$, PPH4$_M$) through the intermediary of a via structure formed in the intermediate insulating layer 35B. Then, the other end of the upper conductive path segment (PPH1$_M$, PPH2$_M$, PPH3$_M$, PPH4$_M$) concerned is electrically connected to the power supply electrode pad PVDD through the intermediary of a via structure formed in the uppermost insulating layer 35C.

Note, in FIG. 5, the via structure for establishing the electrical connection between the one end of the lower conductive path segment PPH2$_L$ and the power supply port PP2 is indicated by reference 40$_L$; the via structure for establishing the electrical connection between the other end of the lower conductive path segment PPH2$_L$ and the one end of the upper conductive path segment PPH2$_M$ is indicated by reference 40$_M$; and the via structure for establishing the electrical connection between the other end of the upper conductive path segment PPH2$_M$ and the power supply electrode pad PVDD is indicated by reference 40$_U$.

Also, the wiring-layout 39 comprises four ground conductive paths GPH1, GPH2, GPH3 and GPH4, which are used to establish the electrical connections between the ground electrode pad GVDD and the ground ports GP5, GP6, GP7 and GP8 of the I/O cells C5, C6, C7 and C8, as shown in FIG. 7. Each of the ground conductive paths GPH1, GPH2, GPH3 and GPH4 includes a lower conductive path segment (GPH1$_L$, GPH2$_L$, GPH3$_L$, GPH4$_L$) formed on the lowermost insulating layer 35A, and an upper conductive path segment (GPH1$_M$, GPH2$_M$, GPH3$_M$, GPH4$_M$) formed on the intermediate insulating layer 35B.

One end of the lower conductive path segment (GPH1$_L$, GPH2$_L$, GPH3$_L$, GPH4$_L$) is electrically connected to a corresponding ground port (GP5, GP6, GP7, GP8) through the intermediary of a via structure formed in the basic multi-layered wiring arrangement 34 and the lowermost insulating layer 35A, and the other end of the lower conductive path segment (GPH1$_L$, GPH2$_L$, GPH3$_L$, GPH4$_L$) is electrically connected to one end of a corresponding upper conductive path segment (GPH1$_M$, GPH2$_M$, GPH3$_M$, GPH4$_M$) through the intermediary of a via structure formed in the intermediate insulating layer 35B. Then, the other end of the upper conductive path segment (PPH1$_M$, PPH2$_M$, PPH3$_M$, PPH4$_M$) concerned is electrically connected to the power supply electrode pad PVDD through the intermediary of a via structure formed in the uppermost insulating layer 35C.

Further, the wiring-layout 39 comprises five signal conductive paths SPH1, SPH2, SPH3, SPH4 and GPH5, which are used to establish the electrical connections between the signal electrode pads PSIG1, PSIG2, PSIG3, PSIG4 and PSIG5 and the signal ports SP2, SP3, SP4, SP6 and SP7 of the I/O cells C2, C3, C4, C6 and C7, as shown in FIG. 7.

The signal conductive path SPH1 is formed on the lowermost insulating layer 35A. One end of the signal conductive path SPH1 is electrically connected to the signal port SP2 of the I/O cell C2 through the intermediary of a via structure formed in the basic multi-layer wiring arrangement 34 and the lowermost insulating layer 35A, and the other end of the signal conductive path SPH1 is electrically connected to the signal electrode pad PSIG1 through the intermediary of a via structure formed in both the intermediate and uppermost insulating layers 35B and 35C.

The signal conductive path SPH2 is formed on the lowermost insulating layer 35A. One end of the signal conductive path SPH2 is electrically connected to the signal port SP3 of the I/O cell C3 through the intermediary of a via structure formed in the basic multi-layer wiring arrangement 34 and the lowermost insulating layer 35A, and the other end of the signal conductive path SPH2 is electrically connected to the signal electrode pad PSIG2 through the intermediary of a via structure formed in both the intermediate and uppermost insulating layers 35B and 35C.

The signal conductive path SPH3 is formed on the lowermost insulating layer 35A. One end of the signal conductive path SPH3 is electrically connected to the signal port SP4 of the I/O cell C4 through the intermediary of a via structure formed in the basic multi-layer wiring arrangement 34 and the lowermost insulating layer 35A, and the other end of the signal conductive path SPH3 is electrically connected to the signal electrode pad PSIG3 through the intermediary of a via structure formed in both the intermediate and uppermost insulating layers 35B and 35C.

The signal conductive path SPH4 is formed on the lowermost insulating layer 35A. One end of the signal conductive path SPH4 is electrically connected to the signal port SP6 of the I/O cell C6 through the intermediary of a via structure formed in the basic multi-layer wiring arrangement 34 and the lowermost insulating layer 35A, and the other end of the signal conductive path SPH4 is electrically connected to the signal electrode pad PSIG4 through the intermediary of a via structure formed in both the intermediate and uppermost insulating layers 35B and 35C.

The signal conductive path SPH5 includes a conductive path segment $SPH5_{L1}$ formed on the lowermost insulating layer 35A, a conductive path segment $SPH_M$ formed on the intermediate insulating layer 35B, and a conductive path segment $SPH5_{L2}$ formed on the lowermost insulating layer 35A. One end of the signal conductive path segment $SPH5_{L1}$ is electrically connected to the signal port SP7 of the I/O cell C7 through the intermediary of a via structure formed in the basic multi-layer wiring arrangement 34 and the lowermost insulating layer 35A, and the other end of the signal conductive path segment $SPH5_{L1}$ is electrically connected to one end of the conductive path segment $SPH_M$ through the intermediary of a via structure formed in the intermediate insulating layer 35B. Then, the other end of the conductive path segment $SPH_M$ is electrically connected to one end of the conductive path segment $SPH5_{L2}$ through the intermediary of a via structure formed in the intermediate insulating layer 35B. Further, the other end of the conductive path segment $SPH5_{L2}$ is electrically connected to the signal electrode pad PSIG5 through the intermediary of a via structure formed in both the intermediate and uppermost insulating layers 35B and 35C. Note, the conductive path segment $SPH_M$ is formed on the intermediate insulating layer 35B so as not to interfere with the conductive paths $GPH3_L$ and $GPH4_L$.

Note, as representatively shown in FIG. 5, although the semiconductor device 26, produced as the flip-chip type BGA chip, is provided with solder balls 41 bonded on the electrode pads PVDD, GVDD, PSIG1, PSIG2, PSIG3, PSIG4 and PSIG5, these electrode pads are omitted from FIGS. 3, 4 and 6.

As is apparent from FIG. 7, the semiconductor device 26 according to the present invention features that all the conductive paths forming the wiring-layout have substantially the same width. This can contribute to miniaturization of the semiconductor device. Also, it is possible to facilitate an automatic design of the wiring-layout of the conductive paths in the external multi-layered wiring arrangement 35 in that the wiring-layout is formed by only the conductive paths having the same width, and thus a freedom of the design of the wiring-layout can be expanded.

In the above-mentioned embodiment, the number (four) of the power supply conductive paths PPH1, PPH2, PPH3 and PHH4 for establishing the electrical connection between the power supply electrode pad PVDD and the I/O buffer 37 is determined in accordance with a predetermined amount of electric current flowing therebetween. Namely, if an amount of electric current flowing between the power supply electrode pad PVDD and the I/O buffer 37 is larger than the predetermined amount, a number of the power supply conductive paths might be increased. Also, if an amount of electric current flowing between the power supply electrode pad PVDD and the I/O buffer 37 is smaller than the predetermined amount, a number of the power supply conductive paths might be decreased. In short, the number of the power supply conductive paths is variable in accordance with the amount of electric current flowing between the power supply electrode pad PVDD and the I/O buffer 37. Of course, this is also true for the number (four) of the ground conductive paths GPH1, GPH2, GPH3 and GHH4 for establishing the electrical connection between the ground pad GVDD and the I/O buffer 37

Figure 8:
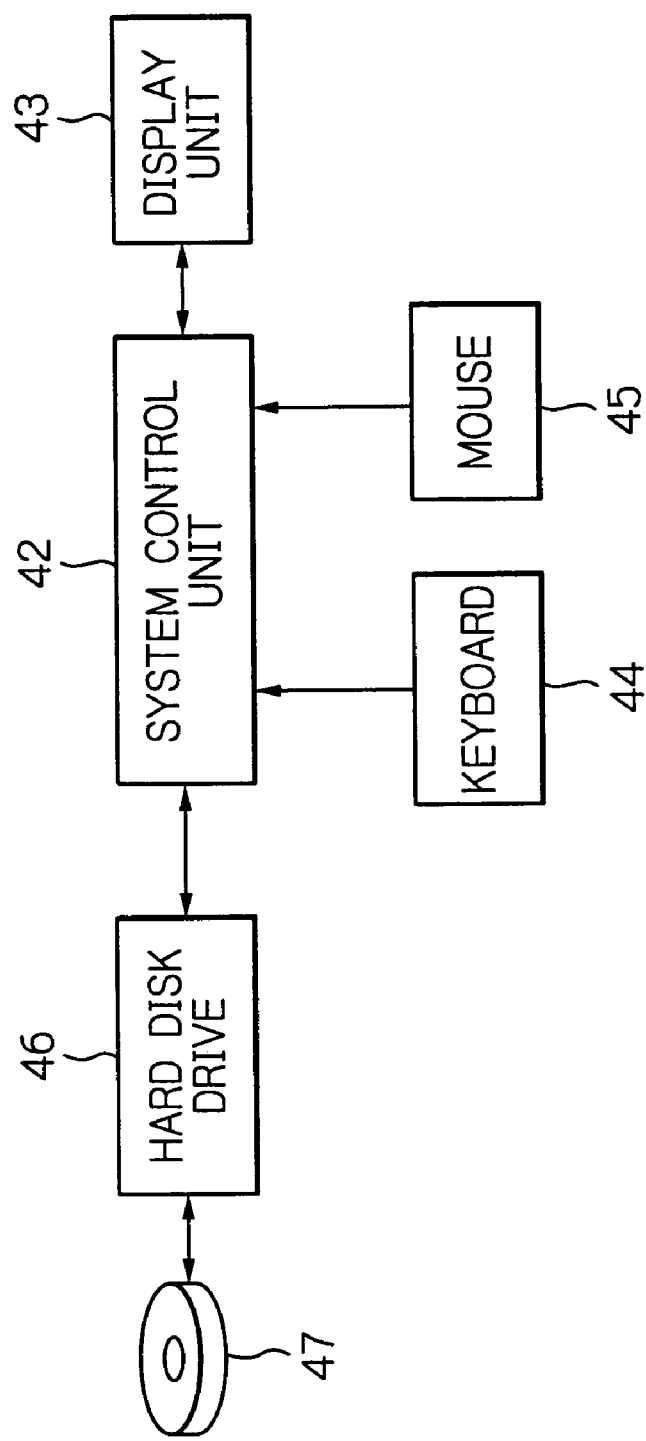
FIG. 8 is a block diagram of a wiring-layout design system for automatically designing a wiring-layout in the external multi-layered wiring arrangement of the semiconductor device according to the present invention.

FIG. 8 shows a wiring-layout design system for automatically designing a wiring-layout of conductive paths in an external multi-layered wiring arrangement (35) of a semiconductor device (26).

The wiring-layout design system comprises a system control unit 42 which contains a microcomputer comprising a central processing unit (CPU), a read-only memory (ROM) for storing various programs and constants, a random-access memory (RAM) for storing temporary data, and an input/output (I/O) interface circuit.

The wiring-layout design system also comprises a display unit 43, such as a cathode ray tube (CRT), a liquid crystal display (LCD) or the like, for displaying a wiring-layout including various electrode pads on a design, and various command items, and a keyboard 44 for inputting various commands and data, necessary for the design of the wiring-arrangement, to the system control unit 42 though the I/o interface circuit thereof. The wiring-layout design system is provided with a mouse 45, which may be used to input a command to the system control unit 42 by clicking the mouse 45 on any one of the command items displayed on the display unit 43.

The wiring-layout design system further comprises a hard disk drive 46 for driving a hard disk 47 in which a wiring-layout design program, other programs, and various tables and so on are stored. The system control unit 42 writes the programs and the various data in the hard disk 47 through the hard disk drive 46, and also reads the various data from the hard disk 47 through the hard disk drive 46.

Also, as conceptually shown in FIG. 9 by way of example, various pad array options I, II, III and IV are previously prepared and stored as a pad array library in the hard disk 47 for every chip size of a semiconductor device to be produced. Each of these pad array options is read from the hard disk 47 through the hard disk drive 46 under control of the system control unit 42 in accordance with a command input through a manipulation of either the keyboard 44 or the mouse 45.

Further, as conceptually shown in FIG. 10 by way of example, various input/output (I/O) buffer options I, II, III and IV are previously prepared and stored as an I/O buffer library in the hard disk 47 for every chip size of a semiconductor device to be produced. Each of these I/O buffer options is read from the hard disk 47 through the hard disk drive 46 under control of the system control unit 42 in accordance with a command input through a manipulation of either the keyboard 44 or the mouse 45.

Figure 11:
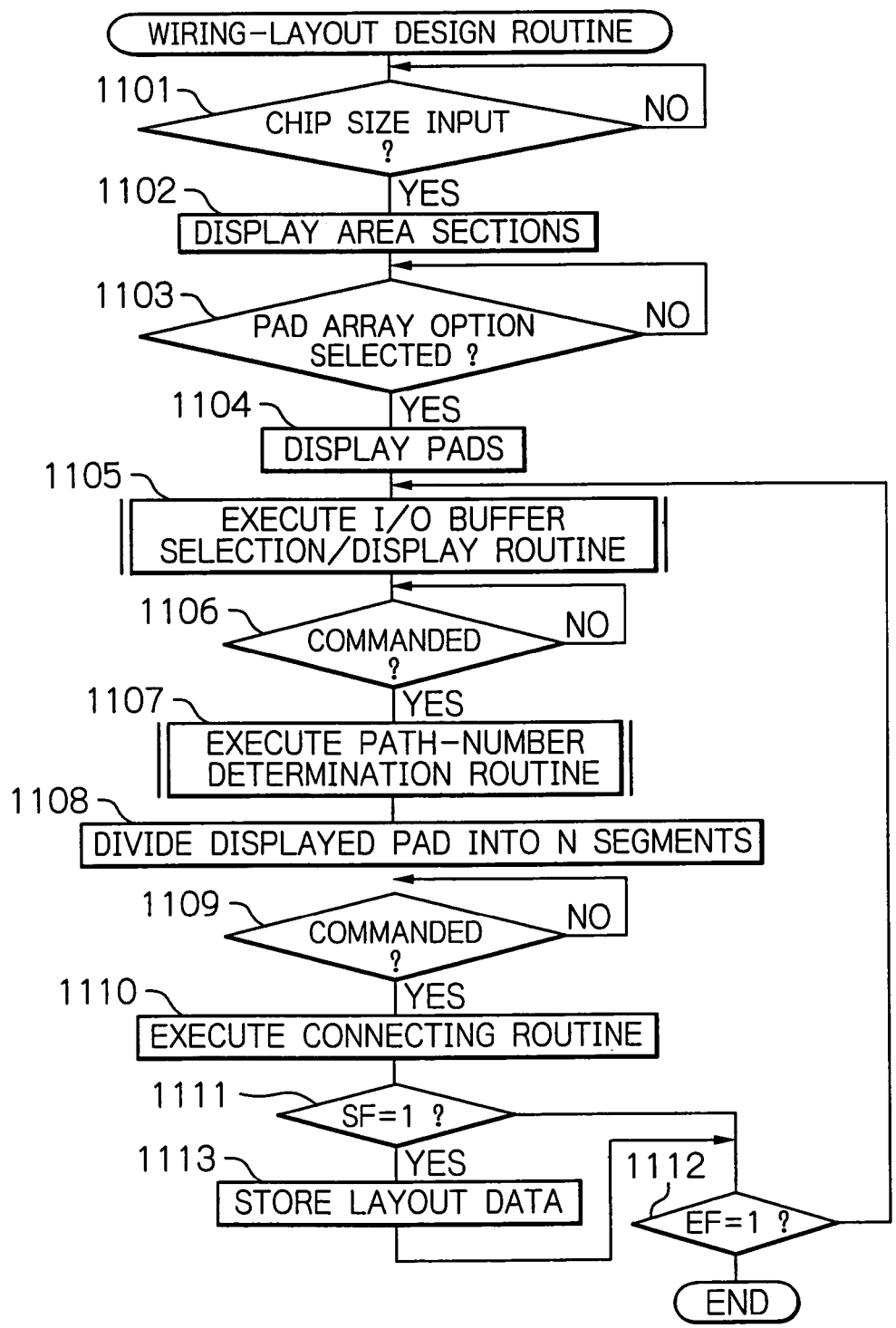
FIG. 11 is a flowchart of a wiring-layout design routine executed in a system control unit shown in FIG. 8.

FIG. 11 shows a flowchart of a wiring-layout design routine for designing a wiring-layout in an external multi-layered wiring arrangement (35) of a semiconductor device

(26) to be produced according to the present invention. Note, an execution of the wiring-layout design routine is started by clicking the mouse 45 on an icon representing the wiring-layout design system on the screen of the display unit 43, and an initial scene is displayed on the screen of the display unit 43.

At step 1101, it is monitored whether a chip size of the semiconductor device (26) to be produced is input to the system control unit 42 through a manipulation of the keyboard 44. Alternatively, the chip size may be input to the system control unit 42 by clicking the mouse 45 on a chip size item displayed on the screen of the display unit 42.

Figure 12:
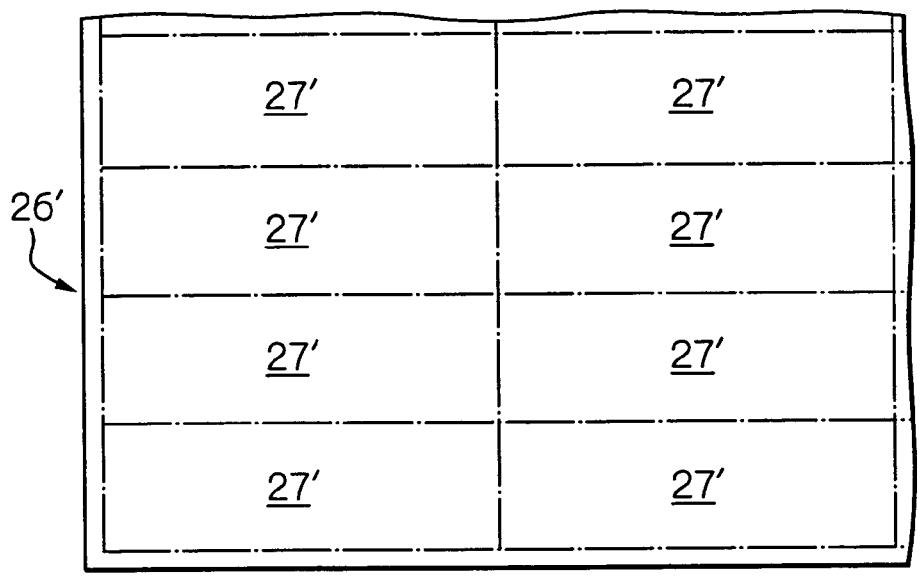
FIG. 12 is a conceptual view illustrating a scene displayed on a screen of a display unit shown in FIG. 8, by way of example, for explaining the wiring-layout design routine.

When the inputting of the chip size is confirmed, the control proceeds to step 1102, in which a plurality of area sections to be defined on a surface of a semiconductor chip are displayed on the screen of the display unit 43 in accordance with the input chip size, as conceptually shown by one-dot lines in FIG. 12. Note, in this drawing, the semiconductor chip is indicated by reference 26', and each of the area sections is indicated by reference 27'.

Then, at step 1103, it is monitored whether one of the pad array options (I, II, III, IV), as shown in FIG. 9 by way of example, is selected. For example, the pad array options (I, II, III, IV) are displayed in a window defined on the screen of the display unit 43, and one of the pad array options is selected by double clicking the mouse 45 on it. When the selection of any one of the pad array options (I, II, III, IV) is confirmed, the control proceeds to step 1104, in which a plurality of electrode pads are displayed and arranged on the screen of the display unit 43.

Figure 13:
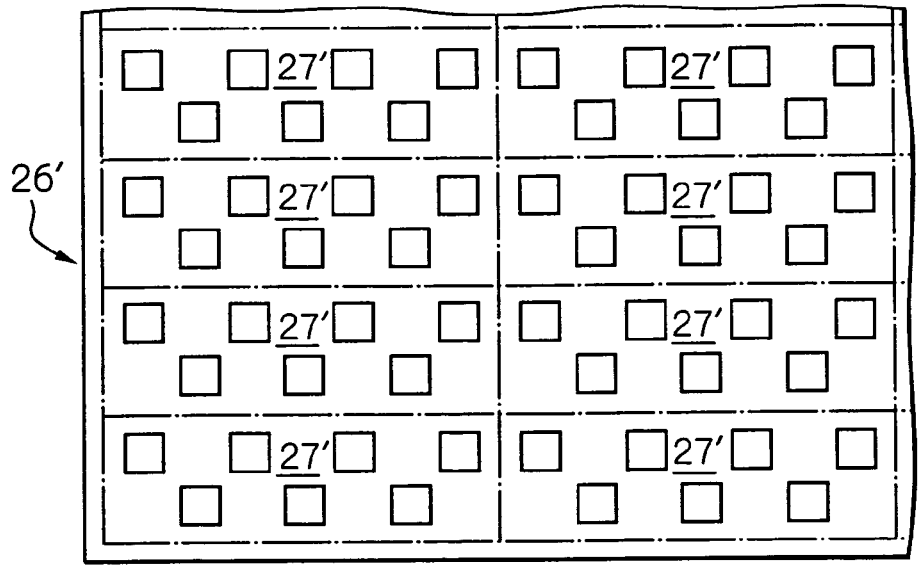
FIG. 13 is a conceptual view illustrating another scene displayed on the screen of the display unit by way of example for explaining the wiring-layout design routine.

For example, when the pad array option I (FIG. 9) is selected, the electrode pads are display and arranged in a staggered manner on the screen of the display unit 43, as conceptually shown in FIG. 13. The pad array option I is used in the production of the semiconductor device 26 shown in FIG. 3 to 7. In this case, a set of seven electrode pads are encompassed by each of the area sections 27'.

Figure 14:
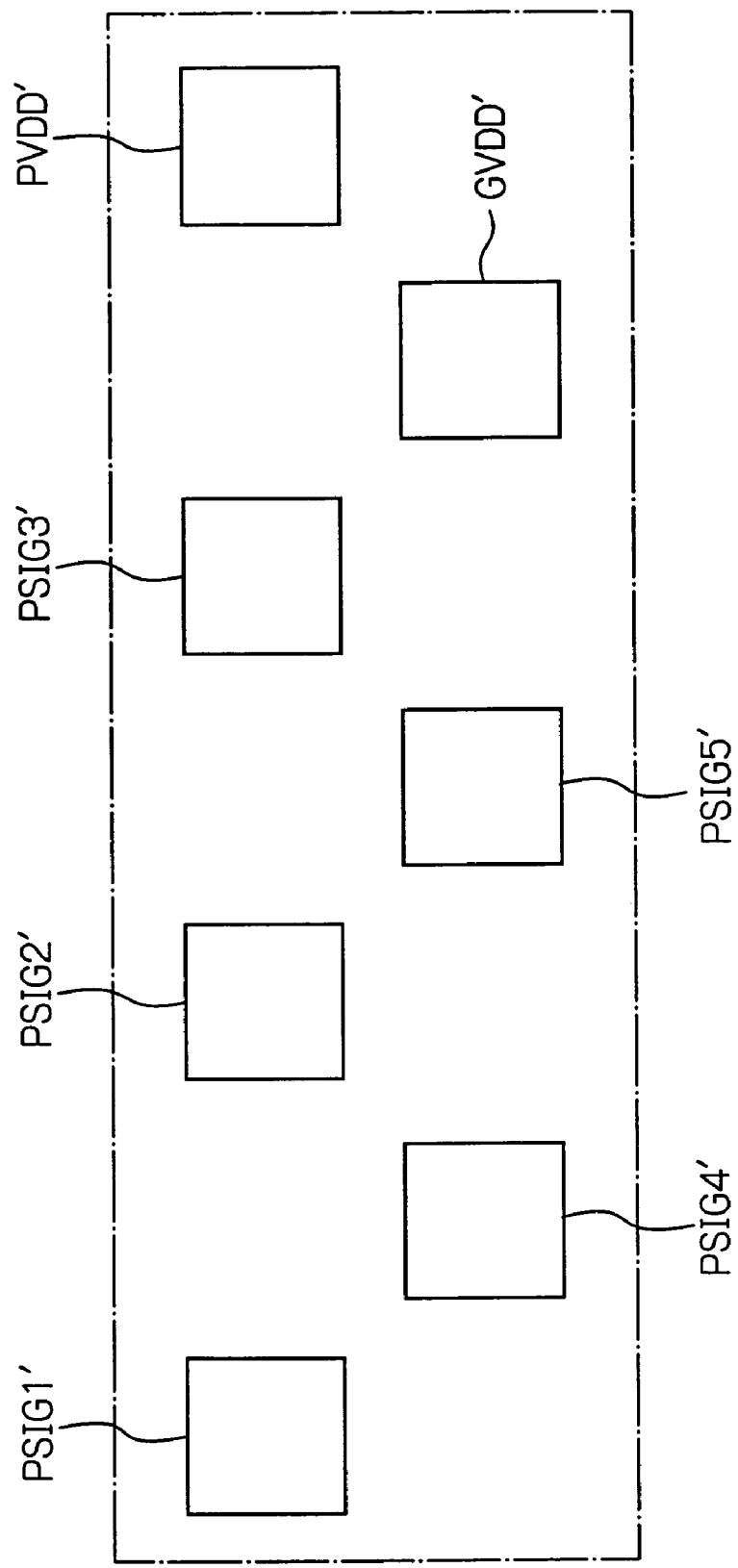
FIG. 14 is a conceptual view illustrating yet another scene displayed on the screen of the display unit by way of example for explaining the wiring-layout design routine.

As representatively and enlargedly shown in FIG. 14, in each of the area sections 27', the seven electrode pads are indicated by references, PVDD', GVDD', PSIG1', PSIG2', PSIG3', PSIG4' and PSIG5'. The electrode pad PVDD' serves as a power supply electrode pad, the electrode pad GVDD' serves as a ground electrode pad, and each of the electrode pads PSIG1', PSIG2', PSIG3', PSIG4' and PSIG5'. Note, in reality, a part of the scene displayed on the screen of the display unit 43 may be enlarged, if necessary, as shown in FIG. 14.

Note, when the pad array option II is selected, the electrode pads are displayed and arranged in a matrix manner on the screen of the display unit 43. Also, note, when the pad array option III is selected, the electrode pads are displayed and arranged in a staggered manner on the screen of the display unit 43 at a pitch closer than that of the pad array when selecting the pad array option I. Further, note, when the pad array option IV is selected, the electrode pads are displayed and arranged in a matrix manner on the screen of the display unit 43 at a pitch closer than that of the pad array when selecting the pad array option II.

Figure 15:
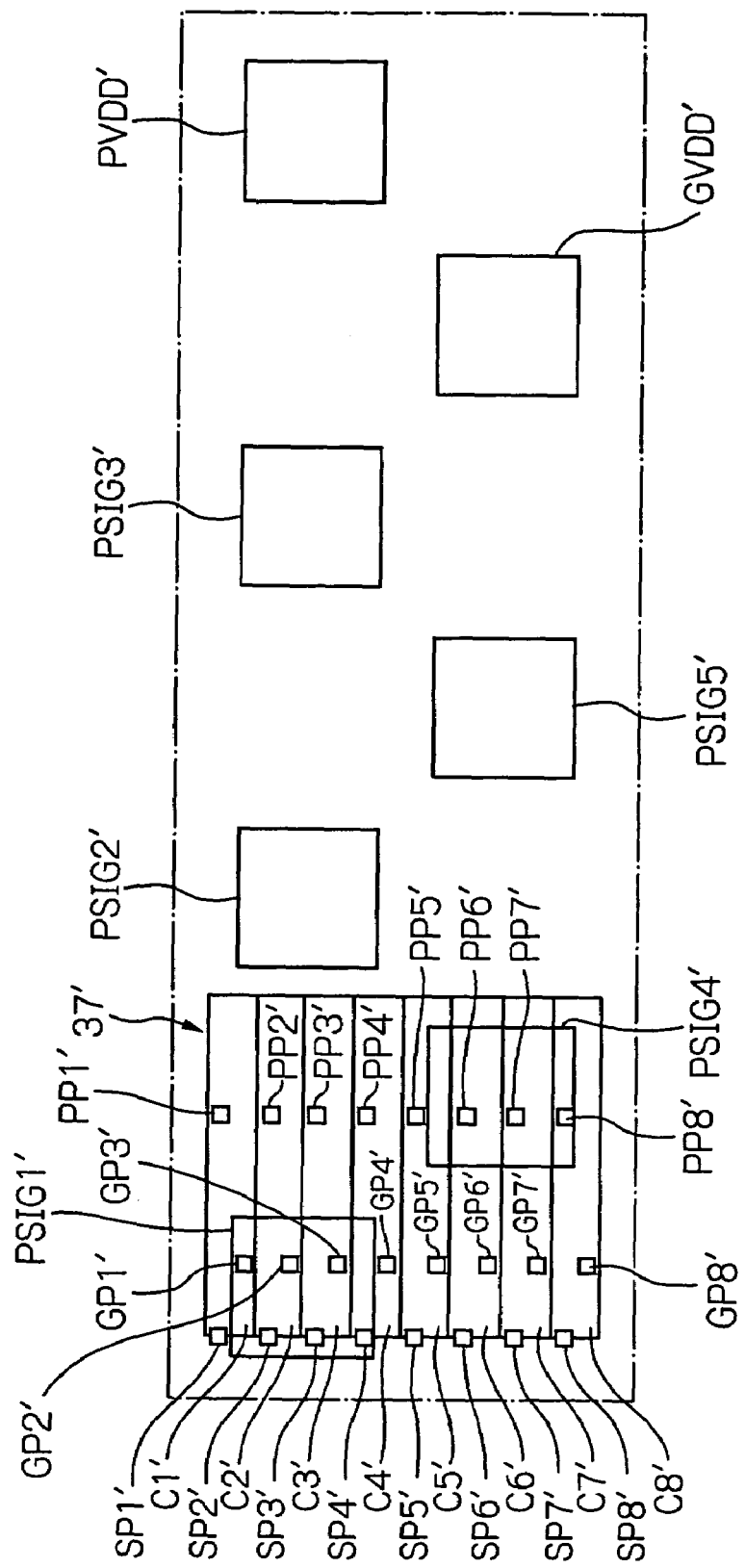
FIG. 15 is a conceptual view illustrating still yet another scene displayed on the screen of the display unit by way of example for explaining the wiring-layout design routine.

After the electrode pads are displayed on the screen of the display unit 43, the control proceeds to step 1105, in which an input/output (I/O) buffer selection/display routine is executed. As stated in detail hereinafter, by executing the I/O buffer selection/display routine, one of the I/O buffer options (I, II, III, IV), as shown in FIG. 10 by way of example, is selected and displayed at a given position in one of the area sections 27', as representatively shown in FIG. 15. Namely, in this drawing, the I/O buffer option concerned is illustrated as an I/O buffer 37'.

The I/O buffer 37' corresponds to the I/O buffer option I shown in FIG. 10, and this I/O buffer option I is used in the production of the semiconductor device 26 shown in FIG. 3 to 7. Accordingly, the displayed I/O buffer 37' comprises a set of eight input/output (I/O) cells C1' to C8', and each of the I/O cells C1' to C8' has a power supply port (PP1', PP2', ..., PP7', PP8'), a ground port (GP1', GP2', ..., GP7', GP8'), and a signal port (SP1', SP2', ..., SP7', SP8') defined thereon.

Note, as is apparent from FIG. 10, similar to the I/O buffer option I, the I/O buffer option II has a set of eight I/O cells, but each of these I/O cells features a longer dimension than that of I/O buffer option I. Also, note, the I/O buffer option III has a set of ten I/O cells. Further, note, similar to the I/O buffer option III, the I/O buffer option VI has a set of ten I/O cells, but each of these I/O cells features a longer dimension than that of I/O buffer option III.

After the execution of the I/O buffer selection/display routine is completed, the control proceeds to step 1106, in which it is monitored whether a command for determining a number of conductive paths connecting between the I/O buffer 37' and the power supply electrode pad PVDD' in the area section 27' concerned is inputted to the system control unit 42 through a manipulation of the keyboard 44. Note, this command may be input to the system control unit 42 by clicking the mouse 45 on a corresponding command item displayed on the screen of the display unit 43.

When the inputting of the command for determining the number of conductive paths is confirmed, the control proceeds to step 1107, in which a path-number determination routine is executed. By executing the path-number determination routine, a number N of power supply conductive paths for establishing electrical connection between the I/O buffer 37' and the power supply electrode pad PVDD' is calculated and determined on the basis of an amount of electric current flowing therebetween, as stated in detail hereinafter. Note, in each of the area sections 27', a number of ground conductive paths for establishing electrical connection between the I/O buffer 37' and the ground electrode pad GVDD' is equal to the number N of power supply conductive paths.

Figure 16:
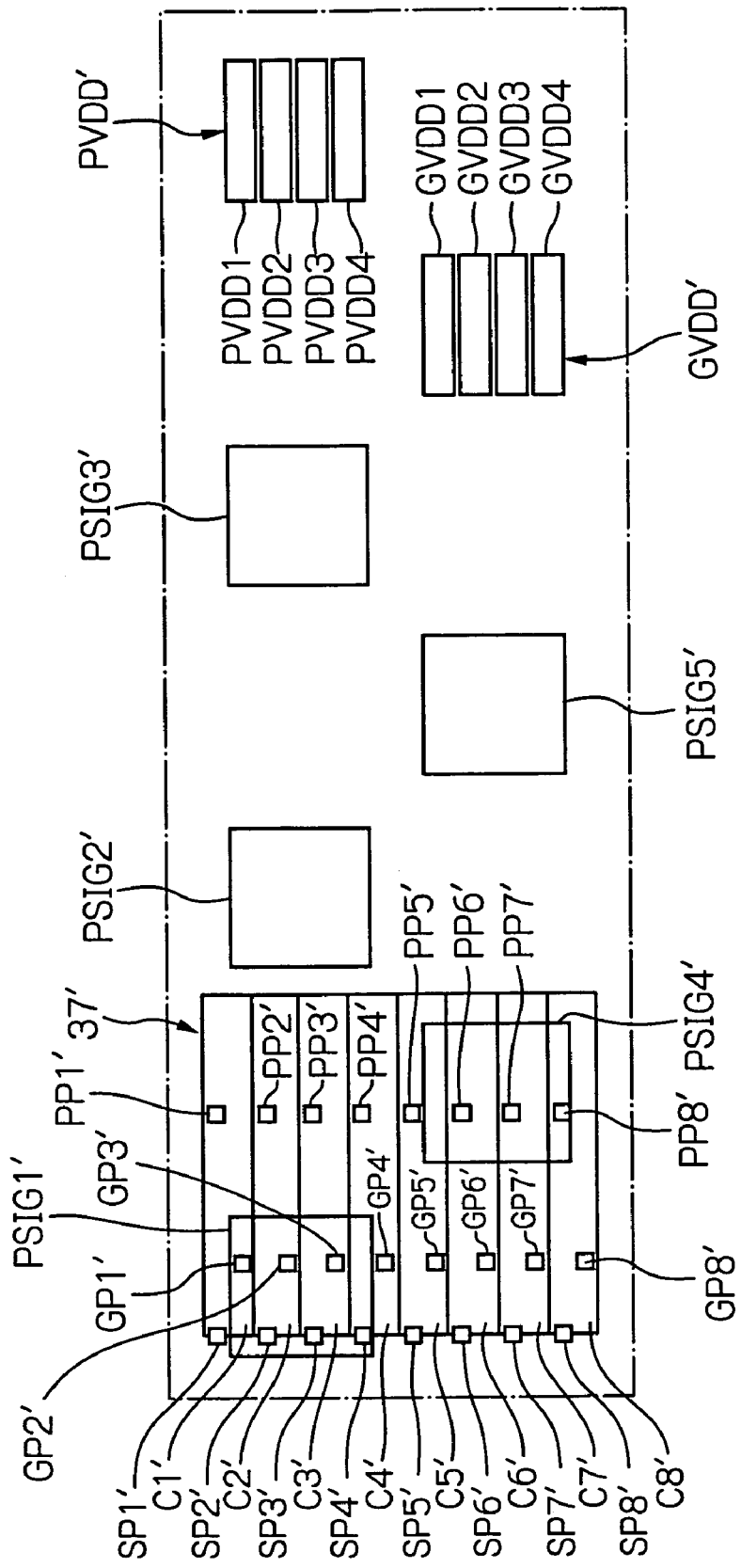
FIG. 16 is a conceptual view illustrating still yet another scene displayed on the screen of the display unit by way of example for explaining the wiring-layout design routine.

After the determination of the number N of power supply conductive paths, the control proceeds to step 1108, in which each of the displayed electrode power supply and ground pads PVDD' and GVDD' is divided into N segments. For example, if N=4, each of the displayed electrode pads PVDD' and GVDD' is divided into four segments (PVDD1, PVDD2, PVDD3 and PVDD4; and GVDD1, GVDD2, GVDD3 and GVDD4), as shown in FIG. 16. Then, at step 1109, in which it is monitored whether a command for executing a well-known conventional automatic connecting routine is inputted to the system control unit 42 through a manipulation of the keyboard 44. Note, this command may be input to the system control unit 42 by clicking the mouse 45 on a corresponding command item displayed on the screen of the display unit 43.

When the inputting of the command for executing the automatic connecting routine is confirmed, the control proceeds to step 1110, in which the automatic connecting routine is executed. In the execution of the automatic connecting routine, first, the system control unit 43 determines a number L of insulating layers to be included in an external multi-layered wiring arrangement of the semiconductor device (26), which is necessary for production of a wiring-layout in the external multi-layered wiring arrangement to establish electrical connections between the I/O buffer 37' and the electrode pads PVDD', GVDD', PSIG1', PSIG2', PSIG3', PSIG4' and PSIG5'. For example, when L=3, the external multi-layered wiring arrangement includes a lowermost insulating layer formed on a basic multi-layered wiring arrangement of the semiconductor device (26), an intermediate insulating layer formed on the lowermost insulating layer, and an uppermost insulating layer formed on the intermediate insulating layer, and the electrode pads PVDD', GVDD', PSIG1', PSIG2', PSIG3', PSIG4' and PSIG5' are formed on the uppermost insulating layer.

Figure 17:
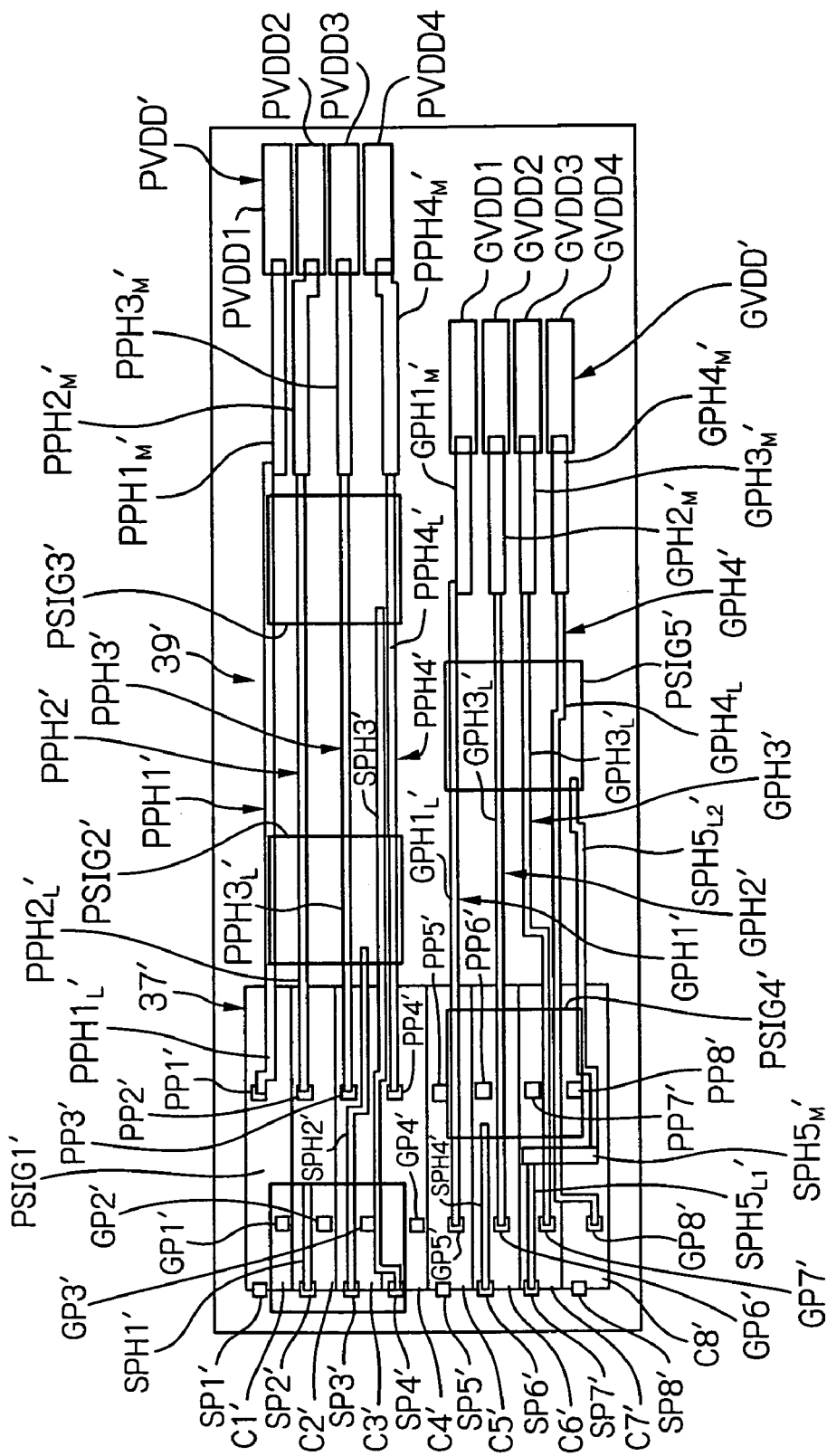
FIG. 17 is a conceptual view illustrating still yet another scene displayed on the screen of the display unit by way of example for explaining the wiring-layout design routine.

Then, as representatively shown in FIG. 17 by way example, the wiring-layout, generally indicated by reference 39', is produced and displayed on the screen of the display unit 43 to establish the electrical connections between the I/O buffer 37' and the electrode pads PVDD', GVDD', PSIG1', PSIG2', PSIG3', PSIG4' and PSIG5'. Note, before the execution of the automatic connecting routine, a customer's requirements are previously input to the system control unit 43 through a manipulation of the keyboard 44, and the production of the wiring-layout 39' is carried out in accordance with the customer's requirements.

In particular, in the example shown in FIG. 17, the wiring-layout 39' comprises four power supply conductive paths PPH1', PPH2', PPH3' and PPH4' for establishing the electrical connections between the segment PVDD1, PVDD2, PVDD3 and PVDD4 of the power supply electrode pad PVDD' and the power supply ports PP1', PP2', PP3' and PP4' of the I/O cells C1', C2', C3' and C4'. Each of the power supply conductive paths PPH1', PPH2', PPH3' and PPH4' includes a lower conductive path segment (PPH1$_L$', PPH2$_L$', PPH3$_L$', PPH4$_L$') formed on the lowermost insulating layer of the external multi-layered wiring arrangement, and an upper conductive path segment (PPH1$_M$', PPH2$_M$', PPH3$_M$', PPH4$_M$') formed on the intermediate insulating layer of the external multi-layered wiring arrangement.

One end of the lower conductive path segment (PPH1$_L$', PPH2$_L$', PPH3$_L$', PPH4$_L$') is electrically connected to a corresponding power supply port (PP1', PP2', PP3', PP4') through the intermediary of a via structure (not shown) formed in the basic multi-layered wiring arrangement and the lowermost insulating layer of the external multi-layered wiring arrangement, and the other end of the lower conductive path segment (PPH1$_L$', PPH2$_L$', PPH3$_L$', PPH4$_L$') is electrically connected to one end of a corresponding upper conductive path segment (PPH1$_M$', PPH2$_M$', PPH3$_M$', PPH4$_M$') through the intermediary of a via structure (not shown) formed in the intermediate insulating layer of the external multi-layered wiring arrangement. Then, the other end of the upper conductive path segment (PPH1$_M$', PPH2$_M$', PPH3$_M$', PPH4$_M$') is electrically connected to a corresponding segment (PVDD1, PVDD2, PVDD3, PVDD4) of the power supply electrode pad PVDD' through the intermediary of a via structure (not shown) formed in the uppermost insulating layer of the external multi-layered wiring arrangement.

Note, as shown in FIG. 17, although the upper conductive path segments PPH1$_M$', PPH2$_M$', PPH3$_M$' and PPH4$_M$' are displayed as thicker path segments in comparison with the lower conductive path segments PPH1$_L$', PPH2$_L$', PPH3$_L$' and PPH4$_L$', so that the upper conductive path segments PPH1$_M$', PPH2$_M$', PPH3$_M$' and PPH4$_M$' and the lower conductive path segments PPH1$_L$', PPH2$_L$', PPH3$_L$' and PPH4$_L$' can be easily distinguished from each other on the screen of the display unit 43, in reality, the upper conductive path segments PPH1$_M$', PPH2$_M$', PPH3$_M$' and PPH4$_M$' have substantially the same width as that of the lower conductive path segments PPH1$_L$', PPH2$_L$', PPH3$_L$' and PPH4$_L$'.

As shown in FIG. 17, the wiring-layout 39' also comprises four ground conductive paths GPH1', GPH2', GPH3' and GPH4' for establishing the electrical connections between the segment GVDD1, GVDD2, GVDD3 and GVDD4 of the ground electrode pad GVDD' and the ground ports GP5', GP6', GP7' and GP8' of the I/O cells C5', C6', C7' and C8'. Each of the ground conductive paths GPH1', GPH2', GPH3' and GPH4' includes a lower conductive path segment (GPH1$_L$', GPH2$_L$', GPH3$_L$', GPH4$_L$') formed on the lowermost insulating layer of the external multi-layered wiring arrangement, and an upper conductive path segment (GPH1$_M$', GPH2$_M$', GPH3$_M$', GPH4$_M$') formed on the intermediate insulating layer of the external multi-layered wiring arrangement.

One end of the lower conductive path segment (GPH1$_L$', GPH2$_L$', GPH3$_L$', GPH4$_L$') is electrically connected to a corresponding ground port (GP5', GP6', GP7', GP8') through the intermediary of a via structure (not show) formed in the basic multi-layered wiring arrangement and the lowermost insulating layer of the external multi-layered wiring arrangement, and the other end of the lower conductive path segment (GPH1$_L$', GPH2$_L$', GPH3$_L$', GPH4$_L$') is electrically connected to one end of a corresponding upper conductive path segment (GPH1$_M$', GPH2$_M$', GPH3$_M$', GPH4$_M$') through the intermediary of a via structure (not shown) formed in the intermediate insulating layer of the external multi-layered wiring arrangement. Then, the other end of the upper conductive path segment (PPH1$_M$', PPH2$_M$', PPH3$_M$', PPH4$_M$') is electrically connected to a corresponding segment (GVDD1, GVDD2, GVDD3, GVDD4) of the ground electrode pad GVDD' through the intermediary of a via structure (not shown) formed in the uppermost insulating layer of the external multi-layered wiring arrangement.

Note, as shown in FIG. 17, although the upper conductive path segments GPH1$_M$', GPH2$_M$', GPH3$_M$' and GPH4$_M$' are displayed as thicker path segments in comparison with the lower conductive path segments GPH1$_L$', GPH2$_L$', GPH3$_L$' and GPH4$_L$', so that the upper conductive path segments GPH1$_M$', GPH2$_M$', GPH3$_M$' and GPH4$_M$' and the lower conductive path segments GPH1$_L$', GPH2$_L$', GPH3$_L$' and GPH4$_L$' can be easily distinguished from each other on the screen of the display unit 43, in reality, the upper conductive path segments GPH1$_M$', GPH2$_M$', GPH3$_M$' and GPH4$_M$' have substantially the same width as that of the lower conductive path segments GPH1$_L$', GPH2$_L$', GPH3$_L$' and GPH4$_L$'.

Further, as shown in FIG. 17, the wiring-layout 39' comprises five signal conductive paths SPH1', SPH2', SPH3', SPH4' and GPH5' for establishing the electrical connections between the signal electrode pads PSIG1', PSIG2', PSIG3', PSIG4' and PSIG5' and the signal ports SP2', SP3', SP4', SP6' and SP7' of the I/O cells C2', C3', C4', C6' and C7'.

The signal conductive path SPH1' is formed on the lowermost insulating layer of the external multi-layered wiring arrangement. One end of the signal conductive path SPH1' is electrically connected to the signal port SP2' of the I/O cell C2' through the intermediary of a via structure (not shown) formed in the basic multi-layer wiring arrangement and the lowermost insulating layer of the external multi-layered wiring arrangement, and the other end of the signal conductive path SPH1' is electrically connected to the signal electrode pad PSIG1' through the intermediary of a via structure (not shown) formed in both the intermediate and uppermost insulating layers of the external multi-layered wiring arrangement.

The signal conductive path SPH2' is formed on the lowermost insulating layer of the external multi-layered wiring arrangement. One end of the signal conductive path SPH2' is electrically connected to the signal port SP3' of the I/O cell C3' through the intermediary of a via structure (not shown) formed in the basic multi-layer wiring arrangement and the lowermost insulating layer of the external multi-layered wiring arrangement, and the other end of the signal conductive path SPH2' is electrically connected to the signal electrode pad PSIG2' through the intermediary of a via structure (not shown) formed in both the intermediate and uppermost insulating layers of the external multi-layered wiring arrangement.

The signal conductive path SPH3' is formed on the lowermost insulating layer of the external multi-layered wiring arrangement. One end of the signal conductive path SPH3' is electrically connected to the signal port SP4' of the I/O cell C4' through the intermediary of a via structure (not shown) formed in the basic multi-layer wiring arrangement and the lowermost insulating layer of the external multi-layered wiring arrangement, and the other end of the signal conductive path SPH3' is electrically connected to the signal electrode pad PSIG3' through the intermediary of a via structure (not shown) formed in both the intermediate and uppermost insulating layers of the external multi-layered wiring arrangement.

The signal conductive path SPH4' is formed on the lowermost insulating layer of the external multi-layered wiring arrangement. One end of the signal conductive path SPH4' is electrically connected to the signal port SP6' of the I/O cell C6' through the intermediary of a via structure (not shown) formed in the basic multi-layer wiring arrangement and the lowermost insulating layer of the external multi-layered wiring arrangement, and the other end of the signal conductive path SPH4' is electrically connected to the signal electrode pad PSIG4' through the intermediary of a via structure (not shown) formed in both the intermediate and uppermost insulating layers of the external multi-layered wiring arrangement.

The signal conductive path SPH5 includes a conductive path segment $SPH5_{L1}'$ formed on the lowermost insulating layer of the external multi-layered wiring arrangement, a conductive path segment $SPH_{M}'$ formed on the intermediate insulating layer of the external multi-layered wiring arrangement, and a conductive path segment $SPH5_{L2}'$ formed on the lowermost insulating layer of the external multi-layered wiring arrangement. One end of the signal conductive path segment $SPH5_{L1}'$ is electrically connected to the signal port SP7' of the I/O cell C7' through the intermediary of a via structure (not shown) formed in the basic multi-layer wiring arrangement and the lowermost insulating layer of the external multi-layered wiring arrangement, and the other end of the signal conductive path segment $SPH5_{L1}'$ is electrically connected to one end of the conductive path segment $SPH_{M}'$ through the intermediary of a via structure (not shown) formed in the intermediate insulating layer of the external multi-layered wiring arrangement. Then, the other end of the conductive path segment $SPH_{M}'$ is electrically connected to one end of the conductive path segment $SPH5_{L2}'$ through the intermediary of a via structure (not shown) formed in the intermediate insulating layer of the external multi-layered wiring arrangement. Further, the other end of the conductive path segment $SPH5_{L2}'$ is electrically connected to the signal electrode pad PSIG5' through the intermediary of a via structure (not shown) formed in both the intermediate and uppermost insulating layers of the external multi-layered wiring arrangement.

Note, as shown in FIG. 17, although the conductive path segment $SPH_{M}'$ is displayed as a thicker path segment in comparison with the signal conductive path segments $SPH5_{L1}'$ and $SPH5_{L2}'$, so that the conductive path segment $SPH_{M}'$ can be easily distinguished from the signal conductive path segments $SPH5_{L1}'$ and $SPH5_{L2}'$ on the screen of the display unit 43, in reality, the conductive path segment $SPH_{M}'$ has substantially the same width as that of the signal conductive path segments $SPH5_{L1}'$ and $SPH5_{L2}'$. Also, note, the conductive path segment $SPH_{M}'$ is formed on the intermediate insulating layer of the external multi-layered wiring arrangement not so as to interfere with the conductive paths $GPH3_{L}'$ and $GPH4_{L}'$.

After the execution of the automatic connecting routine is completed, the control proceeds to step 1111, in which it is determined whether a storage flag SF is "1" or "0". The storage flag SF is initialized to "0" at the beginning of the execution of the wiring-layout design routine, and is made to "1" when clicking the mouse 45 on a storage item displayed on the screen of the display unit 43 to command storage of the produced wiring-layout data in the hard disk 47.

If SF=0, the control proceeds to step 1112, in which it is determined whether an ending flag EF is "1" or "0" The ending flag EF is initialized to "0" at the beginning of the execution of the wiring-layout design routine, and is made to "1" when clicking the mouse 45 on an ending item displayed on the screen of the display unit 43 to command an ending of the execution of the wiring-layout design routine.

If EF=0, the control returns to step 1105, and the routine comprising steps 1105 to 1110 is repeated to produce a wiring-layout in another area section 27' (FIG. 13).

At step 1111, if SF=1, the control proceeds from step 1111 to step 1113, in which the produced wiring-layout data is stored in the hard disk 47 through the hard disk drive 46. Then, the control proceeds to step 1112. At step 1112, if EF=1, the wiring-layout design routine ends.

Figure 18:
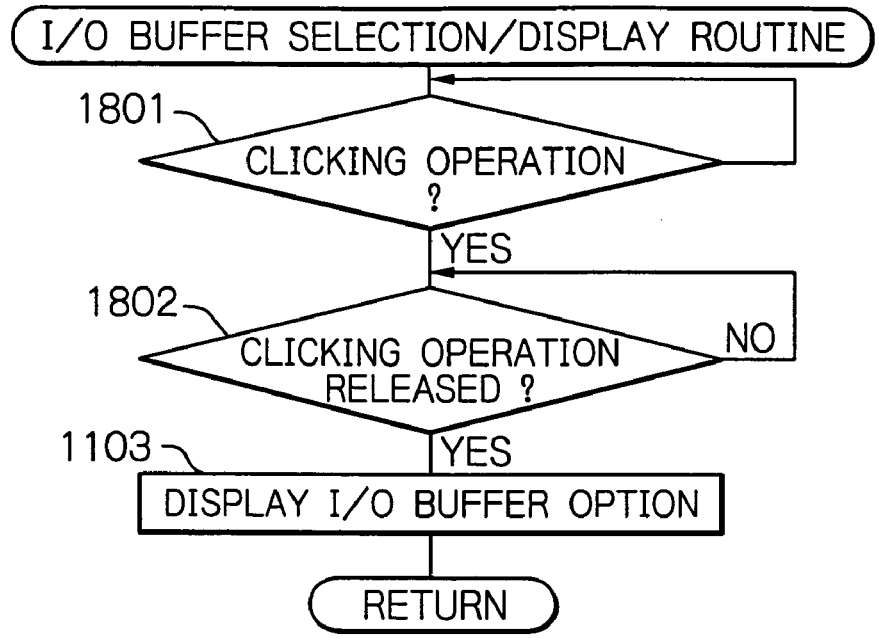
FIG. 18 is a flowchart of an input/output buffer selection/display routine executed as a subroutine in the wiring-layout design routine of FIG. 11.

FIG. 18 shows a flowchart of the I/O buffer selection/display routine executed as a subroutine in step 1105 of FIG. 11. Note, when executing this subroutine, the I/O buffer options (I, II, III, IV), as shown in FIG. 9 by way of example, are displayed in a window defined on the screen of the display unit 43.

At step 1801, it is monitored whether one of the I/O buffer options (I, II, III, IV) displayed in the window is selected by a clicking operation of the mouse 45. When the clicking operation of the mouse 45 is confirmed, the control proceeds to step 1802, in which it is monitored whether the mouse 45 is released from the clicking operation, i.e. whether the selected I/O buffer option is dragged from the window onto one of the area sections 27'. When the release of the clicking operation of the mouse 45 is confirmed, the selected I/O buffer option is displayed on the screen of the display unit 43. Then, the control returns to step 1106 of step 1105 of FIG. 11.

Figure 19:
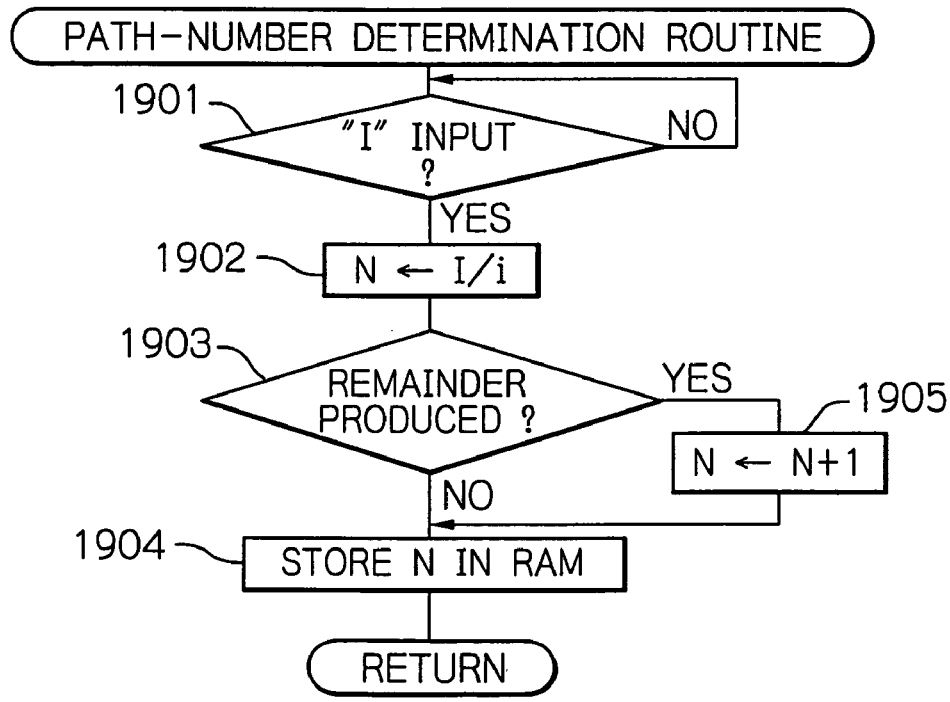
FIG. 19 is a flowchart of a path-number determination routine executed as a subroutine in the wiring-layout design routine of FIG. 11.

FIG. 19 shows a flowchart of a path-number determination routine executed as a subroutine in step 1107 of FIG. 11.

At step 1901, it is monitored whether an amount "I" of electric current flowing between the I/O buffer 37' and the power supply electrode pad PVDD' is input to the system control unit 42 through a manipulation of the keyboard. When the inputting of the amount "I" of electric current to the system control unit 42 is confirmed, the control proceeds to step 1902, in which the following calculation is carried out:

$$N \leftarrow I/i$$

Herein: "i" is a permissible electric current which can flow through a conductive path (PPH1', PPH2', PPH3', PPH4', GPH1', GPH2', GPH3', GPH4', SPH1', SPH2', SPH3', SPH4', GPH5') to be produced in each of the area sections 27'.

At step 1903, it is determined whether there is a remainder of the division I/i. If the remainder of the division I/i is zero, the control proceeds to step 1904, in which the calculation result or quotient N is stored in the RAM of the system control unit 42 as a number of power supply conductive paths for establishing electrical connection between the I/O buffer 37' and the power supply electrode pad PVDD'.

On the other hand, if the remainder of the division I/i is not zero, the control proceeds to step 1905, in which the following calculation is carried out:

$$N \leftarrow N+1$$

Then, the control proceeds to step 1904, in which the calculation result N is stored in the RAM of the system control unit 42 as a number of power supply conductive paths for establishing electrical connection between the I/O buffer 37' and the power supply electrode pad PVDD'. Thereafter, the control returns to step 1108 of FIG. 11.

Finally, it will be understood by those skilled in the art that the foregoing description is of preferred embodiments of the product, and that various changes and modifications may be made to the present invention without departing from the spirit and scope thereof.

The invention claimed is:

1. A semiconductor device having a plurality of area sections defined therein, which device comprises:
   a semiconductor substrate;
   a basic multi-layered wiring arrangement provided on said semiconductor substrate, both the semiconductor substrate and the basic multi-layered wiring arrangement having an internal electronic circuit area section and an input/output (I/O) area section defined in each of said area sections, a plurality of internal electronic circuits being produced in said internal electronic circuit area section, and an input/output (I/O) buffer being produced in said I/O area section, said I/O buffer being suitably and electrically connected to said internal electronic circuits in said basic multi-layered wiring arrangement; and
   an external multi-layered wiring arrangement provided on said basic multi-layered wiring arrangement and having a power supply electrode pad, a ground electrode pad, at least one signal electrode pad formed and arranged on a top surface thereof, and a wiring-layout produced therein to establish electrical connections between said I/O buffer and said electrode pads,
   wherein said wiring-layout includes a plurality of power supply conductive paths for establishing the electrical connection between said I/O buffer and said power supply electrode pad, a plurality of ground conductive paths for establishing the electrical connection between said I/O buffer and said ground electrode pad, and a signal conductive path for establishing the electrical connection between said I/O buffer and said signal electrode pad, and all the conductive paths feature a same width as each other.

2. A semiconductor device as set forth in claim 1, wherein a number N of said power supply conductive paths is determined in accordance with a predetermined amount of electric current flowing between said I/O buffer and the power supply electrode pad.

3. A semiconductor device as set forth in claim 2, wherein a number of said ground conductive paths is equal to the number N of said power supply conductive paths.

4. A semiconductor device as set forth in claim 1, wherein said I/O buffer has a plurality of input/output (I/O) cells, and each of the I/O cells has a power supply port, a ground port, and a signal port defined thereon, each of said power supply conductive paths being electrically connected to one of said power supply ports, each of said ground conductive paths being electrically connected to one of said ground ports, each of said signal conductive paths being electrically connected to one of said signal ports.

5. A semiconductor device as set forth in claim 4, wherein said external multi-layered wiring arrangement includes a lowermost insulating layer formed on said basic multi-layered wiring arrangement, at least one intermediate insulating layer formed on said lowermost insulating layer, and an uppermost insulating layer formed on said intermediate insulating layer, and each of said power supply and ground conductive paths includes a lower conductive path segment formed on said lowermost insulating layer, and an upper conductive path segment formed on said intermediate insulating layer, one end of said lower conductive path segment being electrically connected to a corresponding port of an I/O cell of said I/O buffer through a via structure formed in said basic multi-layered wiring arrangement and the lowermost insulating layer of said external multi-layered wiring arrangement, another end of said lower conductive path segment being electrically connected to one end of said upper conductive path segment through a via structure formed in said intermediate insulating layer, the other end of said upper conductive path segment being electrically connected to a corresponding electrode pad through a via structure formed in said uppermost insulting layer.

6. A wiring-layout design system for designing a wiring-layout in an external multi-layer wiring arrangement of a semiconductor device as set forth in claim 1, which system comprises:
   a display unit that displays a surface of a semiconductor chip for producing said semiconductor device;
   an area section definition system that defines a plurality of area sections to be defined on the displayed surface of said semiconductor chip in accordance with a chip size thereof;
   an electrode pad array definition system that regularly defines a plurality of electrode pads on the displayed surface of said semiconductor chip such that a set of a power supply electrode pad, a ground pad, and at least one signal electrode pad is displayed on each of said area sections;
   an input/output (I/O) buffer definition system that defines an input/output (I/O) buffer on each of said area sections;
   a path-number determination system that determines a number N of conductive paths for establishing an electrical connection between said I/O buffer and each of said power supply and ground electrode pads in accordance with a predetermined amount of electric current flowing therebetween;
   a pad division/display system that divides each of said power supply and ground electrode pads into N pad segments on said display unit; and a wiring-layout definition system that defines a wiring-layout, to be produced in the external multi-layered wiring arrangement of said semiconductor device, on each of said area sections to establish electrical connections between said I/O buffer and said pad segments and signal pad.

7. A wiring-layout design system as set forth in claim 6, wherein said wiring-layout includes a plurality of power supply conductive paths for establishing the electrical connection between said I/O buffer and the pad segments of said power supply electrode pad, a plurality of ground conductive paths for establishing the electrical connection between said I/O buffer and the pad segments of said ground electrode pad, and a signal conductive path for establishing the electrical connection between said I/O buffer and said signal electrode pad.

8. A wiring-layout design system as set forth in claim 7, wherein said I/O buffer has a plurality of input/output (I/O) cells, and each of the I/O cells has a power supply port, a ground port, and a signal port defined thereon, each of said power supply conductive paths being electrically connected to one of said power supply ports, each of said ground conductive paths being electrically connected to one of said ground ports, each of said signal conductive paths being electrically connected to one of said signal ports.

9. A wiring-layout design system as set forth in claim 8, wherein said external multi-layered wiring arrangement includes a lowermost insulating layer formed on said basic multi-layered wiring arrangement, at least one intermediate insulating layer formed on said lowermost insulating layer, and an uppermost insulating layer formed on said intermediate insulating layer, and each of said power supply and ground conductive paths includes a lower conductive path segment to be formed on said lowermost insulating layer, and an upper conductive path segment to be formed on said intermediate insulating layer, one end of said lower conductive path segment being electrically connected to a corresponding port of an I/O cell of said I/O buffer through a via structure to be formed in said basic multi-layered wiring arrangement and the lowermost insulating layer of said external multi-layered wiring arrangement, another end of said lower conductive path segment being electrically connected to one end of said upper conductive path segment through a via structure to be formed in said intermediate insulating layer, the other end of said upper conductive path segment being electrically connected to a corresponding electrode pad through a via structure to be formed in said uppermost insulting layer.

10. A wiring-layout design system as set forth in claim 9, wherein said lower conductive path segments are displayed on said display unit at a width which is different from that of said upper conductive path segments, so that the lower conductive path segments and the upper conductive path segments can be easily distinguished from each other on the display unit.

11. A semiconductor device comprising:
a power supply electrode pad;
a plurality of input/output (I/O) cells; and
a plurality of power supply conductive paths for establishing electrical connections between said power supply electrode pad and at least a part of said I/O cells,
wherein said power supply conductive paths are independently arranged with respect to each other, and have substantially a same width as each other along an entire length of said power supply conductive paths.

12. A semiconductor device comprising:
a power supply electrode pad;
a plurality of input/output (I/O) cells;
a plurality of power supply conductive paths for establishing electrical connections between said power supply electrode pad and at least a part of said I/O cells,
wherein said power supply conductive paths are independently arranged with respect to each other, and have substantially a same width as each other;
a plurality of signal pads; and
a signal conductive path for establishing an electrical connection between each of said signal pads and a corresponding one of said I/O cells,
wherein each of said signal conductive paths has substantially a same width as said power supply conductive paths.

13. A semiconductor device comprising:
a power supply electrode pad;
a first input/output (I/O) cell;
a second input/output (I/O) cell;
a first power supply conductive path for establishing an electrical connection between said power supply electrode pad and said first I/O cell; and
a second power supply conductive path for establishing an electrical connection between said power supply electrode pad and said second I/O cell,
wherein said first and second power supply conductive paths are independently arranged with respect to each other.

\* \* \* \* \*